United States Patent
Kwon et al.

(10) Patent No.: US 10,933,414 B2
(45) Date of Patent: Mar. 2, 2021

(54) MICROCHEMICAL SYSTEM APPARATUS AND RELATED METHODS OF FABRICATION

(71) Applicant: BOARD OF TRUSTEES OF MICHIGAN STATE UNIVERSITY, East Lansing, MI (US)

(72) Inventors: Patrick Kwon, Okemos, MI (US); Junghoon Yeom, Okemos, MI (US)

(73) Assignee: BOARD OF TRUSTEES OF MICHIGAN STATE UNIVERSITY, East Lansing, MI (US)

(*) Notice: Subject to any disclaimer, the term of this patent is extended or adjusted under 35 U.S.C. 154(b) by 554 days.

(21) Appl. No.: 15/685,095

(22) Filed: Aug. 24, 2017

(65) Prior Publication Data

US 2018/0056292 A1 Mar. 1, 2018

Related U.S. Application Data

(60) Provisional application No. 62/378,932, filed on Aug. 24, 2016.

(51) Int. Cl.
*C04B 35/01* (2006.01)
*B01J 19/00* (2006.01)
(Continued)

(52) U.S. Cl.
CPC ......... *B01L 3/502707* (2013.01); *B01J 8/008* (2013.01); *B01J 8/34* (2013.01);
(Continued)

(58) Field of Classification Search
CPC ........ B01J 2219/00824; B81C 1/00476; B81C 2201/0108–0109; B81B 2201/058
See application file for complete search history.

(56) References Cited

U.S. PATENT DOCUMENTS 6,193,501 B1* 2/2001 Masel .................... F23C 13/00
422/177
2010/0288479 A1* 11/2010 Meng .................. B81C 99/0085
165/177

OTHER PUBLICATIONS

Kwon, Patrick. Final Report, Development of an Efficient Micro-Heat Exchanger: The Integration of Design, Processing and Testing. (2006 date is speculated—see Requirement for Information) (Year: 2006).*

(Continued)

*Primary Examiner* — Erin Snelting
(74) *Attorney, Agent, or Firm* — Marshall, Gerstein & Borun LLP

(57) ABSTRACT

The disclosure relates to microchemical (or microfluidic) apparatus as well as related methods for making the same. The methods generally include partial sintering of sintering powder (e.g., binderless or otherwise free-flowing sintering powder) that encloses a fugitive phase material having a shape corresponding to a desired cavity structure in the formed apparatus. Partial sintering removes the fugitive phase and produces a porous compact, which can then be machined if desired and then further fully sintered to form the final apparatus. The process can produce apparatus with small, controllable cavities shaped as desired for various microchemical or microfluidic unit operations, with a generally smooth interior cavity finish, and with materials (e.g., ceramics) able to withstand harsh environments for such unit operations.

27 Claims, 10 Drawing Sheets

(51) Int. Cl.
  B81C 99/00    (2010.01)
  B32B 18/00    (2006.01)
  C04B 35/64    (2006.01)
  B01L 3/00     (2006.01)
  B01J 8/00     (2006.01)
  B01J 8/34     (2006.01)
  B01J 19/02    (2006.01)
  C04B 35/65    (2006.01)
  G01N 30/68    (2006.01)

(52) U.S. Cl.
  CPC .......... B01J 19/0093 (2013.01); B01J 19/02 (2013.01); B32B 18/00 (2013.01); B81C 99/0085 (2013.01); C04B 35/01 (2013.01); C04B 35/65 (2013.01); B01J 2219/0086 (2013.01); B01J 2219/00281 (2013.01); B01J 2219/00788 (2013.01); B01J 2219/00804 (2013.01); B01J 2219/00822 (2013.01); B01J 2219/00824 (2013.01); B01J 2219/00862 (2013.01); B01J 2219/00894 (2013.01); B01L 3/502715 (2013.01); B01L 2200/027 (2013.01); B81B 2201/058 (2013.01); C04B 2235/32 (2013.01); C04B 2235/5445 (2013.01); C04B 2235/604 (2013.01); C04B 2235/656 (2013.01); C04B 2235/6562 (2013.01); C04B 2235/6565 (2013.01); C04B 2235/6567 (2013.01); C04B 2235/95 (2013.01); C04B 2235/963 (2013.01); C04B 2235/9615 (2013.01); C04B 2237/34 (2013.01); C04B 2237/343 (2013.01); C04B 2237/345 (2013.01); C04B 2237/348 (2013.01); C04B 2237/62 (2013.01); C04B 2237/64 (2013.01); G01N 30/68 (2013.01)

(56) References Cited

OTHER PUBLICATIONS

Do, Truong et al. Fabrication of Powder-based Ceramic Micro-burners. Procedia Manufacturing, vol. 5, 2016, pp. 455-465. (Year: 2016).*
Do, Truong et al. Fully-Enclosed Ceramic Micro-burners Using Fugitive Phase and Powder-based Processing. Scientific Reports, 6, 31336 (2016). (Year: 2016).*
Ekbote, B., P. Kwon, M.B. Prime. Micromechanics-based Design and Processing of Efficient Meso-scale Heat Exchanger. 21st Annual Technical Conference of the American Society for Composites, 2006. (Year: 2006).*
POCO Graphite. Properties and Characteristics of Graphite. Jan. 2015, pp. 1, 24. (Year: 2015).*
Klocke, F., Gerent, O. & Schippers, C. in *Machining of Ceramics and Composites* (eds Jahanmir, S. et al.) Ch. 1, 1-10 (Marcel Dekker, 1998).
Arana et al., A microfabricated suspended-tube chemical reactor for thermally efficient fuel processing. *J. Microelectromech. Syst.* 12, 600-612 (2003).
Bae et al., Development of a portable gas analyzer using a micro-gas chromatograph/flame ionization detector (micro-GC/FID) for NASA's environmental missions. *42nd International Conference on Environmental Systems*; Jul. 15-19, 2012; San Diego, CA, USA; (AIAA, 2012).
Bauer et al., Design and prototyping of a ceramic micro turbine: a case study. *Microsyst. Technol.* 16, 607-615 (2010).
Bauer et al., Development of a rapid prototyping process chain for the production of ceramic microcomponents. *J. Mater. Sci.* 37, 3127-3140 (2002).
Beckel et al., Thin films for micro solid oxide fuel cells. *J. Power Sources* 173, 325-345 (2007).
Bienert et al., Characterization and improvement of {LTCC} composite materials for application at elevated temperatures. *J. Eur. Ceram. Soc.* 30, 369-374 (2010).
Cocco et al., Externally reformed solid oxide fuel cell-micro-gas turbine (SOFC-MGT) hybrid systems fueled by methanol and di-methyl-ether (DME). Energy 34, 2124-2130 (2009).
DeMello, Control and detection of chemical reactions in microfluidic systems. *Nature* 442, 394-402 (2006).
DiCarlo et al., A. Comparison by the use of numerical simulation of a MCFC-IR and a MCFC-ER when used with syngas obtained by atmospheric pressure biomass gasification, *Int. J. Hyd. Energy* 36, 7976-7984 (2011).
Fujiwara et al., Development of new high-purity alumina. *Sumitomo Kagaku* 1-10 (2007).
Garbayo et al., Full ceramic micro solid oxide fuel cells: towards more reliable MEMS power generators operating at high temperatures. *Energy Environ. Sci.* 7, 3617-3629 (2014).
Gongora-Rubio et al., Overview of low temperature co-fired ceramics tape technology for meso-system technology (MsST). *Sensor. Actuat. A: Phys.* 89, 222-241 (2001).
Guan et al., Catalytic combustion of methane over pd-based catalyst supported on a macroporous alumina layer in a microchannel reactor. *Chem. Eng. J.* 144, 270-276 (2008).
Hillman et al., Constant heating rate analysis of simultaneous sintering mechanisms in alumina. *J. Mater. Sci.* 27, 2641-2648 (1992).
Holthaus et al., Comparison of micropatterning methods for ceramic surfaces. *J. Eur. Ceram. Soc.* 31, 2809-2817 (2011).
Ibáñez-Garcia et al., Green-tape ceramics. New technological approach for integrating electronics and fluidics in microsystems. *TrAC Trends Anal. Chem.* 27, 24-33 (2008).
Jain et al., Synthesis of nanoparticles in high temperature ceramic microreactors: design, fabrication and testing. *Int. J. Appl. Ceram. Technol.* 6, 410-419 (2009).
Jensen et al., Tools for chemical synthesis in microsystems. *Lab on a Chip* 14, 3206-3212 (2014).
Jensen, Microreaction engineering—is small better?. *Chem. Eng. Sci.* 56, 293-303 (2001).
Jiang et al. Design and packaging of a highly integrated microreactor system for high-temperature on-board hydrogen production. *Chem. Eng. J.* 275, 206-219 (2015).
Jurkow et al., Overview on low temperature co-fired ceramic sensors. *Sensor. Actuat. A: Phys.* 233, 125-146 (2015).
Kenis et al., Fabrication of ceramic microscale structures. *J. Am. Ceram. Soc.* 90, 2779-2783 (2007).
Keramiotis et al., Porous burners for low emission combustion: An experimental investigation. *Energy* 45, 213-219 (2012).
Khoong et al., Carbon burnout and densification of self-constrained {LTCC} for fabrication of embedded structures in a multi-layer platform. *J. Eur. Ceram. Soc.* 29, 457-463 (2009).
Khoong et al., Overview on fabrication of three-dimensional structures in multi-layer ceramic substrate. *J. Eur. Ceram. Soc.* 30, 1973-1987 (2010).
Kim et al., Development of a micro-flame ionization detector using a diffusion flame. *Sensor. Actuat B: Chem.* 168, 111-117 (2012).
Knitter et al., Ceramic microreactors for heterogeneously catalysed gas-phase reactions. *Lab Chip* 4, 378-383 (2004).
Knitter et al., Manufacturing of ceramic microcomponents by a rapid prototyping process chain. *Adv. Eng. Mater.* 3, 49-54 (2001).
Lindstrom et al., Diesel fuel reformer for automotive fuel cell applications. *Int. J. Hyd. Energy* 34, 3367-3381 (2009).
Mandi et al., Modelling of an updraft fixed-bed gasifier operated with softwood pellets. *Fuel* 89, 3795-3806 (2010).
Marre et al., Design and packaging of microreactors for high pressure and high temperature applications. *Ind. Eng. Chem. Res.* 49, 11310-11320 (2010).
McMullen et al., Integrated microreactors for reaction automation: New approaches to reaction development. *Annu. Rev. Anal. Chem.* 3, 19-42 (2010).
Miesse et al., Submillimeter-scale combustion. *AIChE J.* 50, 3206-3214 (2004).

(56) References Cited

OTHER PUBLICATIONS

Mitchell et al., Ceramic microreactors for on-site hydrogen production from high temperature steam reforming of propane. *Lab Chip* 6, 1328-1337 (2006).
Mitchell et al., Ceramic microreactors for on-site hydrogen production. *J. Catal.* 241, 235-242 (2006).
Morales et al., Fabrication of ceramic microstructures via microcasting of nanoparticulate slurry. *J. Am. Ceram. Soc.* 88, 570-578 (2005).
Peterson et al., Novel microsystem applications with new techniques in low-temperature co-fired ceramics. *Int. J. Appl. Ceram. Technol.* 2, 345-363 (2005).
Roosen, New lamination technique to join ceramic green tapes for the manufacturing of multilayer devices. *J. Eur. Ceram. Soc.* 21, 1993-1996 (2001).
Schmitt et al., Ceramic plate heat exchanger for heterogeneous gas phase reactions *Chem. Eng. Technol.* 28, 337-343 (2005).
Shin et al., Machining channels on mesoscale ceramic components. *J. Manuf. Process.* 6, 15-23 (2004).
Suzuki et al., Microtubular solid-oxide fuel cells for low-temperature operation. *MRS Bull.* 39, 805-809 (2014).
Suzuki et al., Recent development of microceramic reactors for advanced ceramic reactor system. *J. Fuel Cell Sci. Technol.* 7, 31005-31009 (2010).
Swain et al., Effects of nano-silica / nano-alumina on mechanical and physical properties of polyurethane composites and coatings. *Trans. Electric. Electro. Mater.* 14, 1-8 (2013).
Tiggelaar et al., Fabrication and characterization of high-temperature microreactors with thin film heater and sensor patterns in silicon nitride tubes. *Lab Chip* 5, 326-336 (2005).
Yeh et al., Effect of particle size distribution on the sintering of alumina. *J. Am. Ceram. Soc.* 71, 484-487 (1988).
German, Sintering Theory and Practice, pp. 98-111, Wiley (Jan. 1996).
Halcomb et al., Ceramic cutting tools for machining unsintered compacts of oxide ceramics, Ceram. Bull., 61:1311-4 (1982).
Klocke et al., Machining of advanced ceramics in the green state, Ceram. Forum Int., 74:288-90 (1997).
Klocke et al., Green Machining of Advanced Ceramics, IN: Jahanmir et al. (eds.), Machining of Ceramics and Composites, Chapter 1, pp. 1-10, Marcel Dekker (1998).

\* cited by examiner

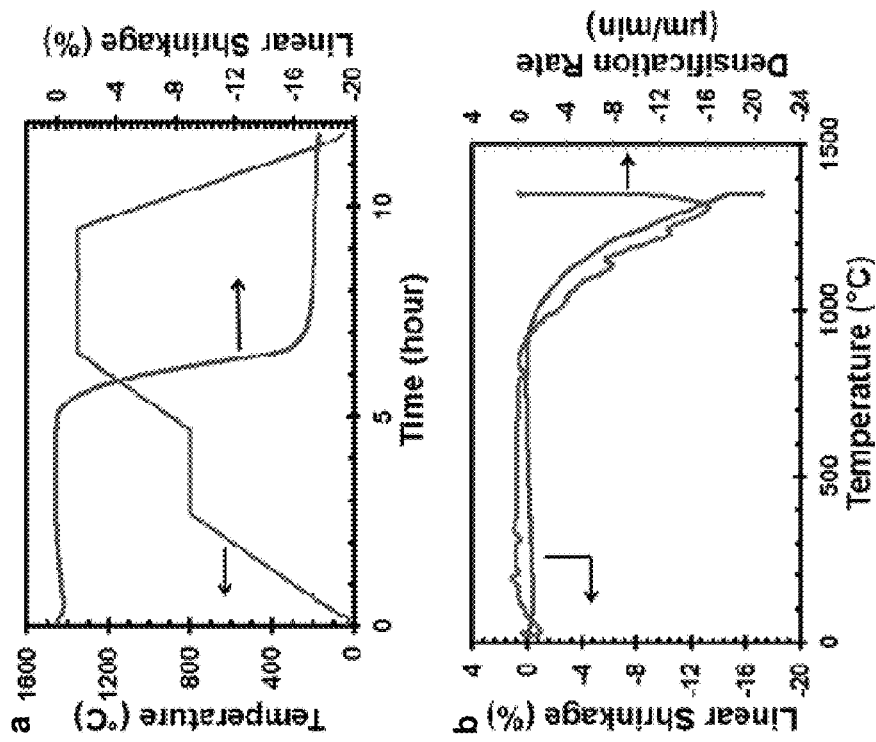
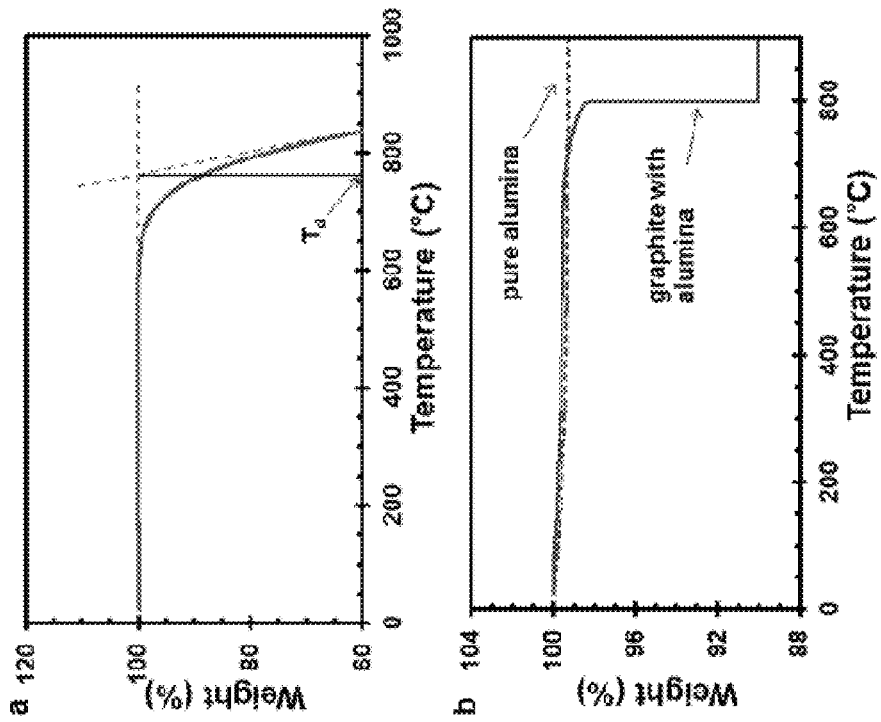
Figure 9
Figure 8

MICROCHEMICAL SYSTEM APPARATUS AND RELATED METHODS OF FABRICATION

CROSS REFERENCE TO RELATED APPLICATION

Priority is claimed to U.S. Provisional Application No. 62/378,932 filed Aug. 24, 2016, which is incorporated herein by reference in its entirety.

STATEMENT OF GOVERNMENT INTEREST

None.

BACKGROUND OF THE DISCLOSURE

Field of the Disclosure

The disclosure relates to relates to microchemical (or microfluidic) apparatus as well as related methods for making the same. The methods generally include partial sintering of sintering powder, removal of a fugitive phase material within the powder to create internal cavities, and then fully sintering the partially sintered compact to provide apparatus with controllable, small, and smooth cavity structures.

Background

Current methods for forming apparatus from sintered powders are often limited in that they require additional components or phases such as binders and/or filler materials. The methods can often result in relatively low-density sintered products with relatively rough interior surface finishes. Methods of making microchemical apparatus from silicon or polymeric materials are generally not suitable for extreme conditions that can be experienced within the apparatus for some applications.

SUMMARY

The disclosure relates to microchemical (or microfluidic) apparatus as well as related methods for making the same. The methods generally include partial sintering of sintering powder (e.g., binderless or otherwise free-flowing sintering powder) that encloses a fugitive phase material having a shape corresponding to a desired cavity structure in the formed apparatus. Partial sintering removes the fugitive phase and produces a porous compact, which can then be machined if desired and then further fully sintered to form the final apparatus. The process can produce apparatus with small, controllable cavities shaped as desired for various microchemical or microfluidic unit operations, with a generally smooth interior cavity finish, and with materials (e.g., ceramics) able to withstand harsh environments for such unit operations.

In one aspect, the disclosure relates to a method for forming a microchemical (or microfluidic) apparatus, the method comprising: (a) providing a (free) first metal oxide powder or nanopowder (e.g., as a layer of (binderless) free-flowing powder in a die or other container, such as to conform the powder to a desired shape prior to sintering and generally corresponding to the shape of the eventual sintered product); (b) placing a first fugitive phase material in the first metal oxide powder (e.g., setting on or (slightly) impressed into a top or other layer of the free-flowing first metal oxide powder), the first fugitive phase material having a geometry corresponding to a negative cavity geometry in the formed microchemical apparatus; (c) placing a (free) second metal oxide powder or nanopowder over the first metal oxide powder and over the first fugitive phase material (e.g., as a layer of free-flowing powder in the die or other container with the first metal oxide powder and first fugitive phase material, such as to conform the first and second metal oxide powders collectively to a desired shape enveloping the first fugitive phase material); (d) partially sintering the first metal oxide powder and the second metal oxide powder at a temperature and pressure sufficient (i) to convert the first fugitive phase material to a gaseous material (e.g., via decomposition, oxidation, or other process) and (ii) to convert the first metal oxide powder and the second metal oxide powder to a porous, partially sintered compact, thereby allowing the gaseous material to escape from the partially sintered compact interior volume and forming an interior cavity within the partially sintered compact interior volume having a geometry corresponding to the original first fugitive phase material geometry; (e) optionally machining the partially sintered compact (e.g., to form one or more channels providing a gaseous or liquid fluid connection between the interior cavity and the external environment to the partially sintered compact, such as by drilling holes through an exterior surface of the compact into the interior cavity); and (f) fully sintering the partially sintered compact at a temperature and pressure sufficient to form a (non-porous) fully sintered microchemical (or microfluidic) apparatus comprising the interior cavity (e.g., the interior cavity from the partially sintered compact and generally corresponding to the original fugitive phase material, where the cavity geometry could be altered in the final, full sintering process, although the degree of shrinking is generally known and controllable to correspondingly precisely control the desired shape and size of the resulting cavity). The machining step (e) is optional for example when the fugitive phase material is shaped so that one or more of its sides/edges abuts a side/edge of the original powder structure formed by the first and second metal oxide powders, thereby forming an inlet and/or outlet port for fluid connection without need for machining. In some cases, it is desirable to include the machining step when there is a limitation in the shape of the fugitive phase relative to the desired inlet and/or outlet port geometry.

In another aspect, the disclosure relates to microchemical (or microfluidic) apparatus formed according to any of the methods disclosed herein. In a refinement, the apparatus is a unitary structure formed by partially and then fully sintering a single collective arrangement of metal oxide powder and fugitive phase material prior to forming the apparatus (e.g., the apparatus is formed without joining together multiple partially or fully sintered apparatus components).

In another aspect, the disclosure relates to microchemical (or microfluidic) apparatus comprising: a fully sintered metal oxide body comprising an interior cavity within the body; wherein: the interior cavity has a minimum dimension (or minimum feature size) in a range from 1 µm to 800 µm (e.g., at least 1, 2, 5, 10, 20, 50, 100, 200, or 300 µm and/or up to 10, 20, 50, 100, 200, 300, 400, 500, 800, or 1000 µm; such as about 100 µm to 500 µm or 100 µm to 1000 µm; minimum dimension or feature size can correspond to a minimum diameter or width of a channel element in the cavity); and the interior cavity has a surface roughness of 20 µm or less (e.g., at least 1, 2, 3, or 5 µm and/or up to 5, 8, 10, 15, or 20 µm).

Various refinements of the first and second metal oxide powders are possible. In a refinement, the first metal oxide powder and the second metal oxide powder are substantially free from binder (e.g., completely free from binder and optionally further substantially free from non-metal oxide material such as glass filler; the sintering powders can contain up to 0.01, 0.1, 0.2, 0.5, 1, 2, or 5 wt. % of materials other than metal oxide powders, which can be a single type of metal oxide powder or multiple types of metal oxide powders in admixture prior to sintering; the first and second metal oxide (or other sintering) powders can be combined in any proportions relative to the total powder).

In another refinement, the first metal oxide powder and the second metal oxide powder independently have a particle size in a range from 1 nm to 1000 nm (e.g., a number-, mass-, or volume-average size or diameter, such as at least 1, 10, 20, 50, 100, or 200 nm and/or up to 10, 20, 50, 100, 200, 400, 600, 800, or 1000 nm; such as about 50 nm to 500 nm; same or different size parameter for the first and second powders).

In another refinement, first metal oxide powder and the second metal oxide powder comprise the same or different ceramic material. In some embodiments, the first and second sintering powders can be other than metal oxide powders (e.g., non-metal oxide ceramics). Some ceramics such as nitrides can be used if oxidation does not occur below the fugitive phase (e.g., graphite or otherwise) burnout temperature. For example, silicon nitride can be used where the graphite can be burnout at about 800° C., and the partially sintered silicon nitride can be fully sintered in nitrogen environment at a higher full sintering temperature.

In another refinement, the first metal oxide powder and the second metal oxide powder comprise one or more of aluminum oxide, zirconium oxide, hydroxyapatite, and zirconiatungstate. More generally, any metal oxide (or other sinterable ceramic material) that can be sintered at higher temperature than the fugitive phase burnout temperature is suitable as the sintering powder(s).

Various refinements of the fugitive phase materials are possible. In a refinement, the first fugitive phase material comprises graphite. Other fugitive phases such as carbon pastes and polymeric materials (e.g. epoxy) can be used, but they often have higher coefficients of thermal expansion (CTE) relative to graphite, which can causes structural failure during sintering.

In another refinement, the first fugitive phase material is in the form of a single piece. For example it can be machined as a monolithic form having the desired shape of the cavity to be formed; the single piece can have a generally planar/2-dimensional shape with its structural features and corresponding eventual cavity/channel elements being substantially in a plane. Alternatively, the single piece can have a generally 3-dimensional shape with its structural features and corresponding eventual cavity/channel elements extending substantially three dimensions, such as forming a 3-dimensional channel network; in another embodiment, the first fugitive phase material can be multiple pieces that are placed on the first metal oxide powder so that they are touching and will form a single connected cavity. In another embodiment, the first fugitive phase material can be multiple pieces that are placed on the first metal oxide powder so that they are not touching and will form multiple separate cavities. In cases where the fugitive phase has a 3-dimensional shape, the sintering powder preferably is distributed uniformly and, instead of uniaxial compaction, hydrostatic pressure can be applied. For example, a circular cavity using cylinder-shaped fugitive phase can be formed. Similarly, multilayered cavities (isolated or connected) can be formed.

In another refinement, the first fugitive phase material has a minimum dimension (or minimum feature size) in a range from 1 μm to 1000 μm (e.g., at least 1, 2, 5, 10, 20, 50, 100, 200, or 300 μm and/or up to 10, 20, 50, 100, 200, 300, 400, 500, 800, or 1000 μm; such as about 100 μm to 500 μm or 100 μm to 1000 μm; minimum dimension or feature size can correspond to a minimum diameter or width of a fugitive phase material element that corresponds to a minimum diameter or width of a channel element in the eventual formed cavity)

In another refinement, the first fugitive phase material has a minimum dimension (or minimum feature size) in a range from 1 nm to 1000 nm (e.g., at least 1, 2, 5, 10, 20, 50, 100, 200, or 300 nm and/or up to 10, 20, 50, 100, 200, 300, 400, 500, 800, or 1000 nm; such as about 2 nm to 500 nm or 5 nm to 100 nm; such as when nano-scale fugitive phase material like exfoliated graphene nanoplatelets is used).

In another refinement, the first fugitive phase material is substantially free from sharp edges (e.g., rounded or otherwise polished or smoothened surfaces (such as by machining) such that sintering powder flow in and around the fugitive phase is not impeded, as sharp fugitive phase material edges deter the powder flow; the corresponding interior cavity walls formed in the final apparatus body can have a low surface roughness, in particular when the fugitive phase material surface is close to perpendicular to the compaction direction and the sintering powder will fill in the all the crevices).

In another refinement, the first fugitive phase material has a surface area of 50% or less of the surface area of a layer of the first metal oxide powder in a plane on which the first fugitive phase material is placed (e.g., a surface area of 50%, 40%, 30%, 20%, 10%, 5%, 2%, or 1% or less and/or at least 0.1%, 1%, 2%, 5%, 10%, or 20% relative to the area of the first metal oxide powder layer).

In another refinement, the first fugitive phase material has a coefficient of thermal expansion of 10 μm/(m*K) or less (e.g., a coefficient of thermal expansion of 1, 2, 4, 5, 6, 8, or 10 μm/(m*K) or less and/or at least 0.01, 0.1, 1, or 2 μm/(m*K), such as 1-8 μm/(m*K) or 2-6 μm/(m*K)).

Various refinements of the sintering steps are possible. In a refinement, partially sintering comprises heating to a temperature in a range from 700° C. to 900° C. (e.g., depending on the burnout temperature of the fugitive phase material, such as based on graphite grade for a specific material).

In another refinement, fully sintering comprises heating to a temperature in a range from 1100° C. to 2000° C. (e.g., where the full sintering temperature depends on the type of metal oxide and final target density; for aluminum oxide, for example, sintering at 1350-1400° C. achieves a density of over 96%, which is sufficient for microreactor applications).

Various refinements of the sintered microchemical apparatus are possible. In a refinement, the fully sintered microchemical apparatus has a density of at least 80% relative to the theoretical density of the first and second metal oxide powders (e.g., at least 80%, 85%, 90%, 95%, or 98% and/or up to 90%, 95%, 98%, 99% or 100% of the theoretical density of the sintering composition/metal oxide powder components thereof, taking into account the solid structure of the apparatus but excluding the void interior volume/cavity therein, where higher density corresponds to lower porosity and higher mechanical strength).

In another refinement, the interior cavity of the microchemical apparatus has a surface roughness of 20 μm or less (e.g., at least 1, 2, 3, or 5 μm and/or up to 5, 8, 10, 15, or 20 μm).

In another refinement, the microchemical apparatus has a structure adapted to function as a microchemical system selected from the group consisting of a chemical reactor (e.g., packed bed reactor), a heat exchanger, a combustor, a separator (e.g., gas/solid or liquid/solid separator), a flame ionization detector.

In another refinement, the interior cavity is fully enclosed by the fully sintered metal oxide body (e.g., corresponding to an interior cavity as originally formed during partial sintering and without drilling or otherwise machining access channels from the body exterior to the interior cavity).

In another refinement, the interior cavity is partially enclosed by the fully sintered metal oxide body (e.g., corresponding to a fully enclosed interior cavity as originally formed during partial sintering but with further drilling or machining of access channels from the body exterior to the interior cavity; alternatively can correspond to a partially enclosed interior cavity as originally formed during partial sintering with a fugitive phase material that abuts an external edge or surface of the metal oxide body in its original powder form).

The disclosed methods can be extended to a repetitive process to build more complex structures. For example, the general method can further comprise comprising before partially sintering in part (d): placing a second fugitive phase material in the second metal oxide powder, the second fugitive phase material having a geometry corresponding to a negative cavity geometry in the formed microchemical apparatus; and placing a (free) third metal oxide powder over the second metal oxide powder and over the second fugitive phase material; wherein partially sintering in part (d) further comprises: partially sintering the first, second, and third metal oxide powders at a temperature and pressure sufficient (i) to convert the first and second fugitive phase materials to a gaseous material and (ii) to convert the first, second, and third metal oxide powders to a porous, partially sintered compact, thereby allowing the gaseous material to escape from the partially sintered compact interior volume and forming one or more interior cavities within the partially sintered compact interior volume having a geometry corresponding to the original first and second fugitive phase material geometries. Generally, the process can be extended to further repetitions of placing/layering fugitive phase materials and metal oxide powders before partial and full sintering to form a final product. The multiple fugitive phase materials can be separate from each other as originally placed in the powder such that corresponding multiple, separate interior cavities are formed. In other cases, the multiple fugitive phase materials can be contacting each other as originally placed in the powder such that a corresponding single interior cavity is formed.

While the disclosed methods, apparatus, compounds, and compositions are susceptible of embodiments in various forms, specific embodiments of the disclosure are illustrated (and will hereafter be described) with the understanding that the disclosure is intended to be illustrative, and is not intended to limit the claims to the specific embodiments described and illustrated herein.

BRIEF DESCRIPTION OF THE DRAWINGS

FIG. 8 includes graphs showing thermogravimetric analysis (TGA) results for: (a) a pure graphite sample; (b) a graphite piece embedded by and compacted with the alumina powder.

FIG. 9 includes graphs showing thermomechanical analysis (TMA) results for compacted, pure alumina sample (3.8 mm in thickness): (a) linear shrinkage (right) and temperature profile (left) plotted with time; (b) linear shrinkage (left) and densification rate (right) plotted with temperature.

DETAILED DESCRIPTION

Figure 1:
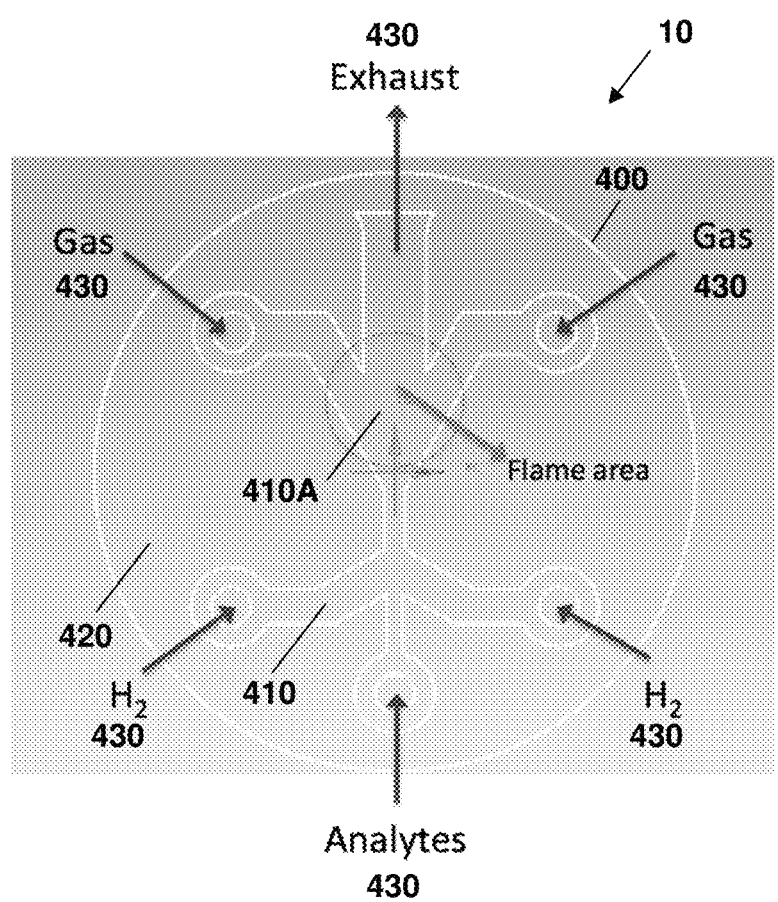
FIG. 1 illustrates a microchemical apparatus according to the disclosure and in the form of a microburner including a combustion chamber.

Microfabrication for most microchemical (or microfluidic) systems (MCSs) has matured around material made of silicon or polymeric materials, which are not suitable for harsh environments such as high pressure, high temperature, and corrosive reactants. Disclosed herein is a powder-based fabrication framework that suitably withstands harsh operating environments and minimizes processing efforts while integrating various components through new processing techniques. Various MCS components can be made, for example micro-reactionware, microchannels, heat exchangers, pack-bed reactors (e.g., a micro-biomass reformer consisting of a pack-bed microreactor for filtration), combustion chambers, high-temperature gas clean-up separators, and high-temperature heat exchangers in addition to a micro flame ionization detector (µFID) serving as an on-chip diagnosis tool. Individual MCS components can be subsequently assembled in a modular fashion for system-level integration.

The disclosed methods provide several advantages, both in terms of processing and the final formed apparatus. A one-pot fabrication method can be used to make an apparatus with open and/or fully enclosed cavities (e.g., as internal channels for the MCS devices). Nearly full-density apparatus can be formed after fully sintering, and without the need for other phases such as binders or fillers. An intermediate, partially sintered structure is suitable for machining additional structure/cavities into the apparatus before final/full sintering. Control of the process permits formation of cavities with desirably small sizes and smooth interior finishes.

Ceramic-based MCSs are more suitable for operation under harsh environments such as high temperature and corrosive reactants compared to the more conventional MCS materials such as silicon and polymers. With the recent renewed interests in chemical manufacturing and process intensification, simple, inexpensive, and reliable ceramic manufacturing technologies are needed. The disclosed powder-based fabrication framework is a one-pot, cost-effective, and versatile process for ceramic MCS component fabrication. The process includes the compaction of metal-oxide nanopowders with a graphite or other fugitive phase that is burned out to create internal cavities and microchannels before full sintering. In illustrative embodiments, pure alumina powder has been used without any binder phase to form a micro-burner/combustion chamber, enabling more precise dimensional control and less structure deformation upon sintering. Process steps such as powder compaction, graphite burnout during partial sintering, machining in a conventional machine tool, and final densification have been examined to characterize the process and impact on the resulting MCS component. This near-full density ceramic structure with the combustion chamber and various internal channels was fabricated to be used as a micro-burner for a gas sensing application.

Miniaturization of chemical system has garnered significant attentions in chemistry and biology due to many advantages such as enhancement in heat/mass transfer rates at small scale, reduction in expensive reagents and hazardous wastes, and facilitation of massive parallelization in reaction/catalyst screening and optimization. The significant technological advancements for MCSs have been focused on chemical reactions, separation, and sensing in a low-to-medium temperature range (20° C. to 600° C.). One notable example is a lab-on-a-chip or micro total analytical system, in which the total sequence of laboratory processes is integrated to perform chemical synthesis, transport, and analysis, and it has profound influence in chemistry and biomedical areas. In some cases, the microreactors and heat exchangers in MCSs need to be operated at high temperatures (>600° C.) and/or under highly corrosive environments like solid-oxide fuel cells, fuel reformers, combustion burners, and gasifiers. However, high-temperature µCSs with sophisticated design and similar level of integration found in low-temperature counterpart have rarely been realized mainly because the conventional MCS materials such as silicon, glass, polymers, metals and conventional metal alloys are not stable at these high operating temperatures. Ceramic materials offer excellent high-temperature compatibility and corrosion resistances, but pose significant manufacturing challenges due to their hardness and brittleness.

Several groups have demonstrated the promise of ceramic-based microreactors for medium-to-high temperature reactions such as hydrogen production from continuous reforming of propane, oxidative coupling of methane, catalytic combustion, and nanoparticle synthesis. Despite these efforts and as discussed below, the current ceramic fabrication techniques still have some or all of the following challenges: (1) These structures are fabricated as open channel/reactors, requiring a joining process to create a fully enclosed system; (2) It is difficult to join or bond ceramic structures—high temperature adhesive typically used may create thermal mismatch, therefore with temperature cycling the joining areas are susceptible to failure; (3) It is difficult to establish a robust fluidic connection using conventional fitting to ceramic structures; and/or (4) It is difficult to monolithically integrate functionally diverse structures. For example, one of the paramount challenges in fabricating ceramic MCSs is that the microfabrication techniques borrowed from well-established microelectronics and microelectromechanical system (MEMS), which are very effective for silicon- or polymer-based MCSs, are not compatible with ceramic materials. Instead, the conventional and non-conventional ceramic processing techniques have been utilized to create ceramic microreactors and other components of MCSs. These techniques include rapid prototyping using low-pressure injection molding, micromachining, sol-gel/nanoparticle casting, and tape casting. In the rapid prototyping process, a negative silicone mold is first created from the original polymer mold fabricated by micro-stereolithography, which is used directly for low-pressure injection molding. The resolution and surface quality of the ceramic components depend on the stereolithography quality of the original polymer mold, and the critical dimension of hundreds of microns (which is a relevant length scale in most MCSs) can be easily obtained. More recently, the smallest feature size on the order of a few microns in ceramic structures has been fabricated using the soft-lithographic molding technique like micromolding in capillaries combined with sol-gel casting. However, these molding/casting-based techniques can create only the open channel or chamber structures due to the demolding requirement. To utilize them in MCS applications, the fabricated structures need to be bonded with or packaged in another high-temperature material to form sealed microchannels or microreactors. Tape casting with low-temperature co-fired ceramic (LTCC) is perhaps the most widely used technique when it comes to the fabrication of the ceramic microreactors and microchannels. While low co-firing/sintering temperature (<900° C.) is beneficial for integrating metal electrodes and other applications, the operation temperature is typically limited due to the presence of the glass phase. Unlike the various molding techniques, tape casting is capable of producing suspended structures, enclosed cavity or microchannels for MCSs. However, the suspended structures tend to deform and sag due to high lamination pressures and the softening of the glass component in the ceramic composite during sintering. Multilayer lamination with fugitive materials such as waxes, polymeric materials, and carbon materials was used to support the embedded structures during lamination and sintering. Wax- and polymer-based fugitive materials, however, were completely burnt out even before the sintering of LTCC, and therefore sagging of the suspended region cannot be prevented during sintering. Moreover, in tape casting, each machined layer needs to be aligned to the previous layers before lamination, entailing some special equipment for alignment and lamination.

The disclosed methods and apparatus address the problems associated with ceramic MCSs and are directed to a simple, inexpensive, reliable, and reproducible ceramic manufacturing technology for high-temperature μCSs and microdevice application. The disclosed methods employ the cold compaction of metal-oxide powders with a graphite or other fugitive phase for the embedded features. In embodiments without a binder phase in the powder mix, the final chemistry and dimension of the sintered ceramic structures can be more precisely tuned. The advantages of the disclosed powder-based technique include one or more of (1) a one-pot, cost-effective process to create either open or fully-enclosed ceramic microreactors and microchannels, (2) near-full density ceramic structures without any other phases (e.g., organic or glass materials) in the final devices, (3) partially-sintered ceramic structures facilitating machining, and (4) abilities to control the surface finish of the internal cavity walls and easily incorporate additional features on the cavity surface. Process steps such as powder compaction, graphite burn-out during partial sintering, machining of partially sintered ceramics, and final densification can be selected/controlled to optimize the process and the properties of the resulting apparatus. As described in the examples below, a fully-enclosed ceramic structure with sub-millimeter internal cavities was formed according to the disclosure to provide an MCS component for micro-burner and micro flame ionization detector (μFID) applications.

FIG. 1 illustrates a microchemical apparatus 10 according to the disclosure and in the form of a microburner including a combustion chamber. The microchemical apparatus 10 includes a fully sintered microchemical apparatus 400, which has a generally solid or continuous (e.g., non-porous) body 420 defining an interior cavity 410 corresponding to the desired structural features of the apparatus 10 (e.g., including a flame or combustion area 410A as indicated). The apparatus 10 can include one or more inlets and/or outlets 430 to the interior cavity. The inlets/outlets 430 can result from machined orifices or other structures in in a partially sintered compact and/or from a fugitive phase material having an exposed edge at an external boundary of the apparatus 10 structure prior to fugitive phase removal (e.g., both being formed as described in more detail below). As illustrated, the inlets/outlets 430 can include ports for (gaseous) analytes, hydrogen ($H_2$) gas, other gases, and exhaust (outlet) gases.

Examples

The examples illustrate the disclosed apparatus, processes, and compositions, but are not intended to limit the scope of any claims thereto. In particular, the examples include illustrative embodiments of the disclosed methods for forming a ceramic microchemical apparatus in the specific context of a ceramic micro-burner.

This example illustrates the disclosed powder processing processes and related apparatus for a micro-burner whose critical dimension is below 1 mm. The micro-burner structural design in the examples was adopted from Kim et al. (2012) without major modifications. Unlike most ceramic processing techniques that start with ceramic powders or sols mixed with polymeric binder phases, however, the disclosed processes employ cold compaction of raw powders while utilizing a graphite fugitive phase to create internal cavities and channels. The processes allow the fabrication of open and fully-enclosed cavities/microchannels, and both configurations were formed in the examples. A micro-burner device with an open ceramic structure covered with a transparent quartz top was employed to visualize and optimize the flame in the micro-burner before the fabrication of the micro-burner with the fully-enclosed combustion chamber. A flat circular disc with a small thickness-to-diameter ratio (~0.1) was selected for the micro-burner apparatus overall geometry, because the thin circular disc is one of the simplest shapes known to successfully compact the powder in a uniform density under a uniaxial load.

Figure 2:
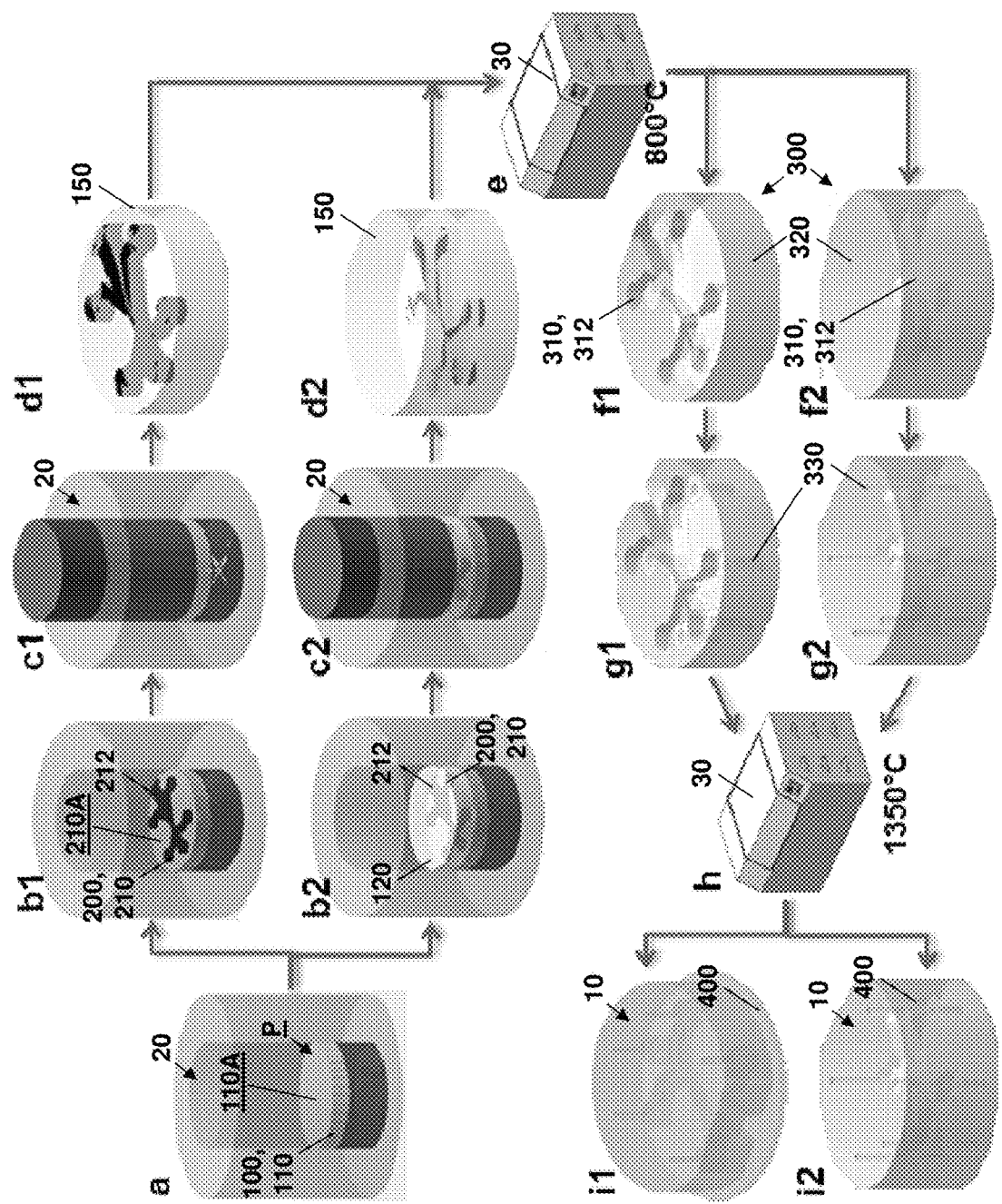
FIG. 2 illustrates the sequence of various disclosed powder processing steps, including: a. powder placement; b. placement of a fugitive phase (for b1 and b2) and the remaining powder (for b2); c-d. powder compaction; e-f. partial sintering and removal of fugitive phase; g. drilling and other machining, and h-i. full sintering.

Fabrication Procedure: The overall fabrication protocols for the two open and closed configurations are depicted in FIG. 2. The open-channel configuration is denoted as '1' (e.g., b1, c1, . . . ) while the fully-enclosed configuration as '2' (e.g. b2, c2, . . . ). The fabrication of the first configuration (open-channel configuration) is only slightly different from the second one (fully-enclosed configuration). Thus, the fabrication protocol for the fully-enclosed micro-burner configuration is described in more detail.

Alpha-phase alumina (AKP-50, Sumitomo in Japan) powder with the purity higher than 99.99% and the particle size between 0.1 and 0.3 micrometer was purchased for fabricating the proposed micro-burners. The common first step is to cut the 0.9 mm thick graphite sheet (EDM-3, Saturn Industries) in a CNC machine into the integrated shape of the combustion chamber and the internal channels. This graphite piece served as a fugitive phase 200 (e.g., first fugitive phase material 210 with a specific shape/geometry 212) that would later burn out during partial sintering and leave the interior cavities 310 for the combustion chamber and the internal channels. Once the graphite fugitive phase 200 was machined, half of the alumina powder to be used (about 2 grams) as the metal oxide powder 100 was poured into a die 20 to serve as the first metal oxide powder 110 (FIG. 2, panel a). Prior to depositing the alumina powder 100, the interior of the die 20, whose inner diameter is 22.2 mm, was lubricated by zinc stearate ($C_{36}H_{70}O_4Zn$) with 12.5-14% of ZnO (Alfa Aesar). This solid lubricant mixture facilitates the release of the powder compact. In addition, it also helps to reduce the frictional force that may be exerted to the powder compact with the graphite fugitive phase. After the first half of the alumina powder 100 was deposited, the die 20 stage was shaken with mild vibration and the punch gently pressed the powder with its own weight (~200 grams) to flatten the powder surface. Subsequently, the machined graphite fugitive phase material 210 was placed onto the powder surface of the first metal oxide powder 110 (FIG. 2, panels b1 and b2). As illustrated, the first fugitive phase material 210 has a surface area 210A which is small (e.g., 50% or less) relative to the surface area 110A of a layer of the first metal oxide powder 110 in a plane P on which the first fugitive phase material 210 is placed. (FIG. 2, panels a and b1). The placement and orientation of the graphite piece 210 with respect to the die reference point is crucial because it is difficult to identify the location of the cavity once the fully-enclosed cavity is formed. The other half of alumina powder 100 was poured into the die 20 to serve as the second metal oxide powder 120 (FIG. 2, panel b2), followed by the full compaction of the powder and the embedded graphite using MTS Insight 300 (MTS Systems Corp.) with the compaction pressure of 50 MPa at a speed of 1 mm·min$^{-1}$ (FIG. 2, panels c1 and c2 showing compression within the die 20, and panels d1 and d2 showing a compressed, non-sintered compact 150 removed from the die 20). The powder compact 150 was then partially sintered in a furnace 30 (Carbolite-HTF1700, UK) at 800° C. for 2 hours to burn out the graphite fugitive phase 210 and form a partially sintered compact 300 (FIG. 2, panels e, f1, and f2). The graphite reacts with oxygen in the furnace and becomes $CO_2$ gas which escapes through the porous wall/body 320 of the partially-sintered alumina compact 300, thus leaving an interior cavity 310 within the compact 300 and generally having a cavity geometry 312 corresponding to the original geometry 212 of the first fugitive phase material 210 (FIG. 2, panels f1 and f2). This partially-sintered compact 300 with the formed interior cavity 310 was drilled to make connecting channels 330 as inlets/outlets for fuel and oxidant sources for the micro-burner applications (FIG. 2, panels g1 and g2). The portion corresponding to the burner exhaust was milled to reveal the embedded channel 310. Finally, the partially-sintered compact 300 was fully sintered in the furnace 30 at 1350° C. to provide the mechanical integrity of the micro-burner in the final microchemical apparatus 10 having a fully sintered body 400 (FIG. 2, panels h, i1 and i2).

Material Characterization:

In order to determine an appropriate partial-sintering temperature and graphite burn-out behavior, a thermogravimetric analysis (TGA Q500, TA Instruments, USA) was conducted at a constant ramping rate (15° C.·min$^{-1}$), which is the same as the temperature ramping rate used in the fabrication process for the examples. TGA measures a change in weight of the sample as a function of temperature, revealing the kinetics of graphite vaporization. During the TGA experiments, air was constantly flowing at 60 mL·min$^{-1}$ to ensure complete oxidation of graphite. The densification process of alumina powder compact during sintering was investigated using a thermomechanical analyzer (TMA, Setaram 95, France). TMA results present the correlation between sintering temperature and sample densification kinetics in real time. A flat compacted sample was placed in between an alumina plate as a base and an alumina probe. The probe was then adjusted to zero. A change in dimension of the sample was measured by recording the movement of the alumina probe. Scanning electron microscopy (SEM) was used to evaluate the microstructures of the partially-sintered alumina samples that were sintered at different temperatures. The presence of the cavity and channels embedded in the fully-enclosed alumina sample was visualized by a computerized tomography (CT) scan (GE eXplore Locus RS micro CT) that has the highest resolution up to 27 µm.

Micro-Burner Testing Setup:

Both configurations of the micro-burners (as schematically shown in FIG. 2) were prepared for the flame testing. A micro-burner with a transparent window was used to characterize the flame shape and optimize the flow rates of fuel and oxidant streams. A quartz disc (25-mm in diameter, Quartz Scientific Inc.) was bonded to the open channel device of the sintered alumina using a medium-temperature adhesive (1531 DURASEL™, maximum service temperature of 343° C.). Through the quartz window attached on the channel side, an oxy-hydrogen flame can be visually observed to determine the presence and location of the flame within the chamber. The holes on the surface of the alumina micro-burner was made to insert the stainless steel (SS) tubing (0.46 mm I.D., 0.90 mm O.D.) for the fluidic connections and fixed with RESBOND™ 907GF, which can endure up to 1260° C. Once the adhesives to bond the quartz window and the SS tubing were cured at room temperature for 24 hours, the micro-burner was completed for testing. Hydrogen and oxygen were created using a commercial electrolyzer (E-65 from h-tec) coupled to the custom-made flow manifold to control the flow rates of each stream. Because the electrolyzer produces hydrogen and oxygen at a fixed stoichiometric ratio ($H_2$:$O_2$=2:1), a miniature pump was added to deliver air to the oxygen line to independently control the fuel-to-oxidant ratio. A flame image was taken using a Nikon camera (D50, shutter speed: 30 second, ISO 2.8) in a dark room. Under the normal circumstances, an oxy-hydrogen flame is not visible to bare eyes or regular cameras, and therefore the special UV intensifier would be required to image the flame. A trace amount of organic contaminants (diffusion oil) was introduced to the combustion system to visualize the flame.

Figure 3:
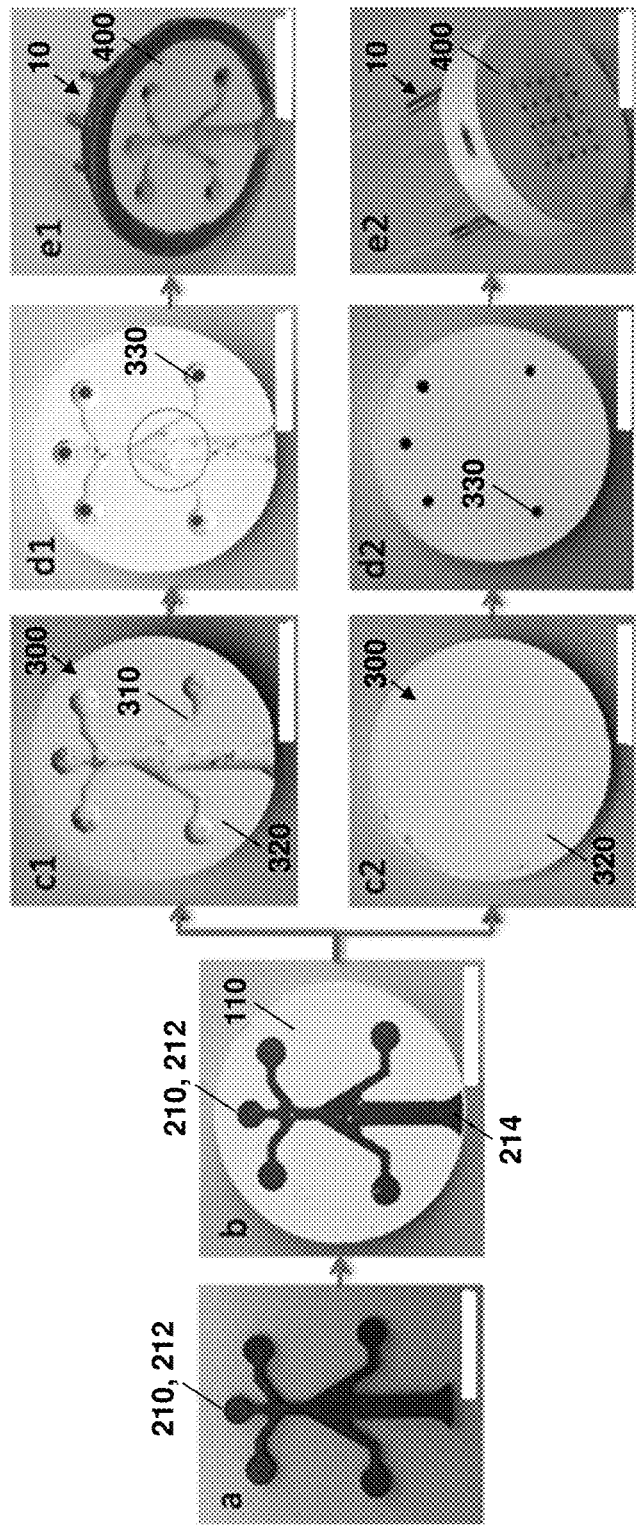
FIG. 3 includes photographs of: a. a 0.9-mm-thick CNC-machined graphite layer; b. the graphite layer inserted into an $Al_2O_3$ powder bed; c. the rest of the powder being applied (only for c2), compacted, and the partially sintered, removing the graphite fugitive phase; d. holes drilled on the partially-sintered alumina devices; e. fluidic tubing connected for micro-burner testing. Scale bar in all images is 1 cm.

Fabrication Results:

FIG. 3 shows photograph images of the micro-burner apparatus in both open and closed configurations in each process stage as described above and schematically illustrated in FIG. 2. The 0.9-mm-thick graphite layer fugitive phase 210 was CNC-machined (FIG. 3, panel a) and sandwiched/cold-pressed into the alumina powder/first metal oxide powder 110 without damage (FIG. 3, panel b). The fabrication result for the open-channel micro-burner with the quartz top is shown in the top row of FIG. 3 (panels c1, d1, e1) while the fully-embedded micro-burner in the bottom row of FIG. 3 (panels c2, d2, e2). For the fully-embedded sample, the other half of the alumina powder/second metal oxide powder 120 was deposited and compacted to what is shown on FIG. 3, panel b. FIG. 3, panel c1 indicates that the graphite layer was completely burned out during the partial sintering at 800° C. as the decomposition temperature of the graphite phase is lower than 800° C. In case of the fully-enclosed sample, whether or not the graphite layer was completely removed was not clear by the visual inspection. The partially-sintered state of the alumina for the compact 300 permits the use of conventional machining (e.g. milling, drilling, etc.) for further modification as illustrated by the holes 330 which were drilled in the partially-sintered alumina burner 300 for fluidic connection (FIG. 3, panels d1 and d2). A medium-temperature epoxy was used to seal the open-channel micro-burner between the 25-mm diameter transparent quartz disc and the 22-mm diameter alumina disc (FIG. 3, panel e1). Stainless Steel (SS) tubing fixed with the high-temperature epoxy provides gas-tight delivery of fuel (e.g. hydrogen) and oxidant (e.g. oxygen and/or air) to the burner cavity (FIG. 3, panels e1 and e2).

Figure 4:
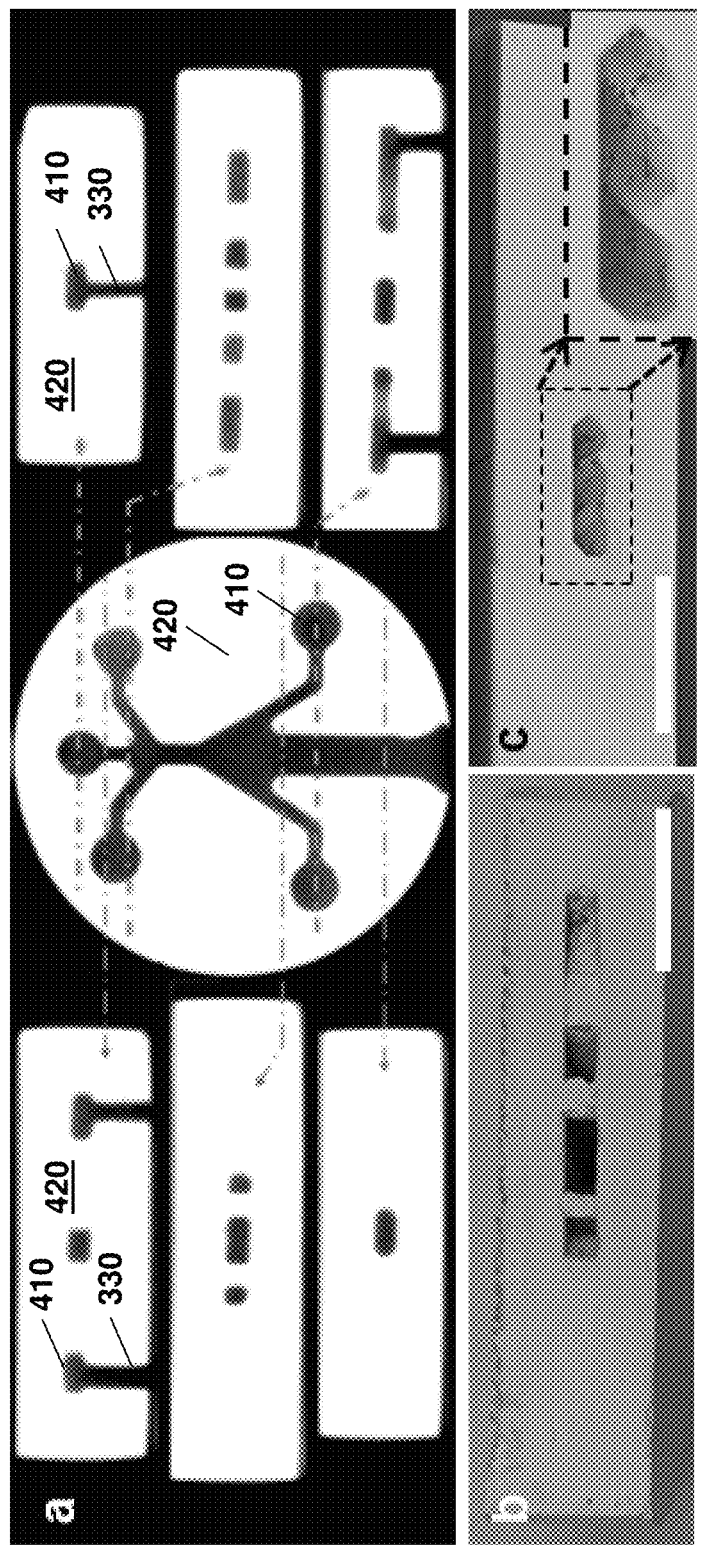
FIG. 4 includes images of the microchemical apparatus internal cavity and channels: (a) X-ray micro-computed tomography (micro-CT) for the fabricated alumina micro-burner with various cross-sectional views; (b) photograph of the cross-sectional view for the same micro-burner; and (c) photograph of the cross-sectional view for the submillimeter internal channel with the additional features on the wall. Scale bar for (b) and (c) is 5 mm.

FIG. 4 shows the cross-section views of the fully-sintered micro-burner 400 with the embedded interior cavity/channel 410 configuration. X-ray micro-computed tomography (micro-CT) technology was used to noninvasively image the internal channels, which include the interior cavity 410 resulting from the eliminated fugitive phase as well as the inlet/outlet structures 330 machined into the pre-sintered compact 300 (FIG. 4, panel a). This technique can be particularly useful to orient and position the interior cavity and channels 410 of the fully-enclosed structure for drilling or other machining process of external features. The interior cavity 410 took the exact shape of the graphite fugitive phase material 210, and the machined holes 330 were well aligned to the internal channels of the interior cavity 410.

The photograph of the crosscut sample reveals that no noticeable cracks or defects were found (FIG. 4, panel b). Performing the micro-CT scan each time to locate the internal feature can be costly. As an alternative, the design was modified by extending the end exhaust part/edge 214 of the graphite fugitive phase material 210 and exposing it to the exterior surface of the micro-burner 400 (i.e., by appropriate original placement in the first metal oxide powder 110), which correspondingly enabled identification of the location of the interior cavity 410 and corresponding channels for machining. This technique also provides additional structures on the channel wall without adding a process step. For example, FIG. 4, panel c shows two protruded lines of the trapezoidal cross-section at the bottom of the sub-millimeter channel embedded in the alumina device, which structures were incorporated by simply making two grooves in the graphite fugitive phase before compaction. This type of the structure would be difficult to be fabricated within the cavity walls using any other conventional ceramic processing techniques.

Figure 5:
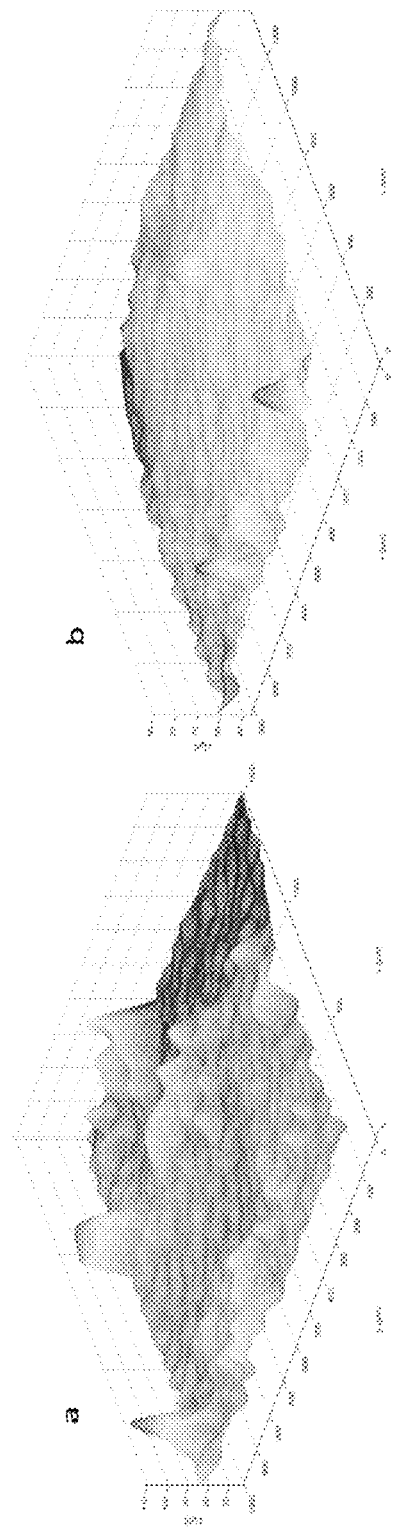
FIG. 5 includes contour graphs showing the topography of the internal alumina channel of the microchemical apparatus samples using: (a) graphite without polishing as the fugitive phase material, and (b) polished graphite as the fugitive phase material.
Figure 6:
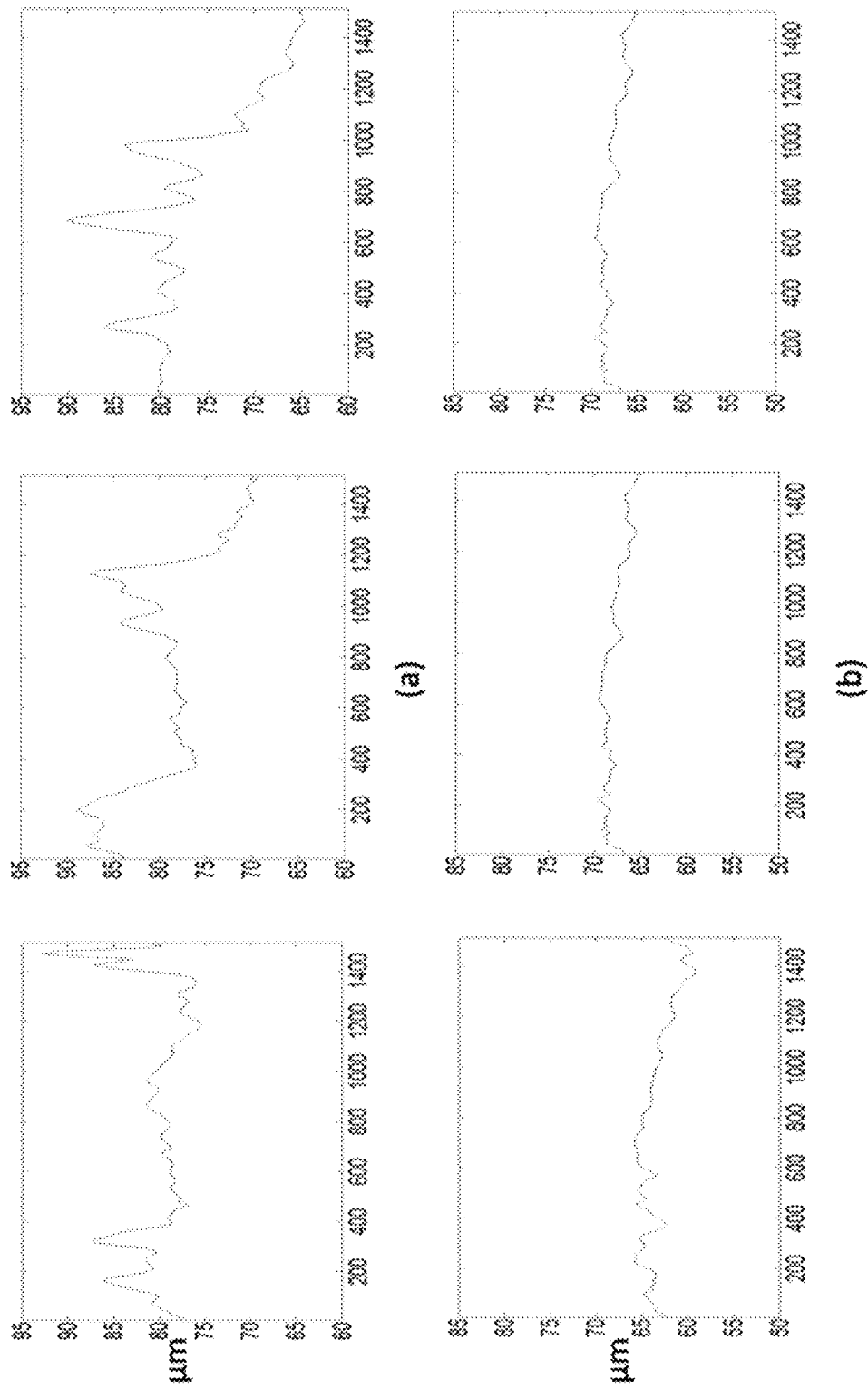
FIG. 6 includes graphs showing topography profiles of random cross sections of the internal alumina channel of the microchemical apparatus samples using: (a) graphite without polishing as the fugitive phase material, and (b) polished graphite as the fugitive phase material.

FIGS. 5 and 6 illustrate that the surface finish quality of interior cavity 410 can be tuned as it is directly related to the surface finish of the fugitive phase 210. Ceramic processing techniques that can create embedded sub-millimeter channels or cavities (e.g. LTCC or 3D printing) in general have difficulties in controlling the surface finish of the internal features. The fugitive phase 210 according to the disclosure permits control the surface quality required for each application. The final surface quality of the interior cavity 410 is directly dependent on the smoothness of the graphite fugitive phase 210 and the size of metal oxide powder 100. To attain the smooth surface, the graphite fugitive phase sheet 210 is polished before being placed into the alumina powder 110 having a powder size between 0.1 and 0.3 micrometer. The resulting surface of interior cavity 410 channel walls is significantly smoother. After sintering, the internal surface of open micro-burners was measured by Confocal Laser Scanning Microscope (Zeiss LSM 210, German). The wavelet-based filtering scheme written in MATLAB was used to eliminate the artifacts. FIG. 5, panel a shows the topography of the sample made with the unpolished graphite fugitive phase 210, where the peaks range between 10 µm to 40 µm on the surface. In contrast, hardly any peak above 10 µm was observed on the surface of the sample made by polished graphite fugitive phase 210 (FIG. 5, panel b). Three random cross-sectional profiles on the measured area were taken to quantify the surface roughness of the resulting ceramic surface. FIG. 6 further shows the improvement in surface finish of the sample with the polished graphite. Three topological profiles of the three random locations were used to evaluate the average surface roughness of the interior cavity 410 by taking the average values of the distances between the adjacent peaks and valleys, resulting in an average surface roughness of 2.9 µm for the alumina surface made from the unpolished graphite fugitive phase 210 and 0.7 µm for that made from the polished graphite fugitive phase 210.

Processing Characterization:

The fully-enclosed design of the alumina micro-burner was used for process characterization including powder compaction, optimization of the sintering temperature profile, and thermogravimetric analysis (TGA) experiments for graphite burn-out. Control of powder compaction during fabrication is important, because the presence of stiff graphite with a complex shape impedes the powder flow, frequently causing non-uniform stress distribution and resulting in cracks in the final component. One simple remedy is to remove sharp edges and geometric complexities in the machined graphite layer. The rounded edges and corners facilitate the powder to flow around them, preventing undesirable cracks due to the non-uniform density distribution. The edges of the graphite after cut in a CNC machine were smoothened by manual grinding. In addition, the sharp protrusion or the feature of graphite with a high aspect ratio makes the resulting powder structure susceptible to crack formation during fully sintering because of the non-uniform density distribution. For example, the region intersecting two gas channels to the combustion chamber was found to be prone to the crack formation (see circled region of FIG. 3, panel d1). Moreover, if the size of the graphite fugitive phase is too large in comparison to the overall ceramic sample, the ceramic sample may become collapsed or fractured. Since the powder holds its shape after compaction with the friction among the powder, the sufficient powder area is needed in terms of both thickness and planform area.

Figure 7:
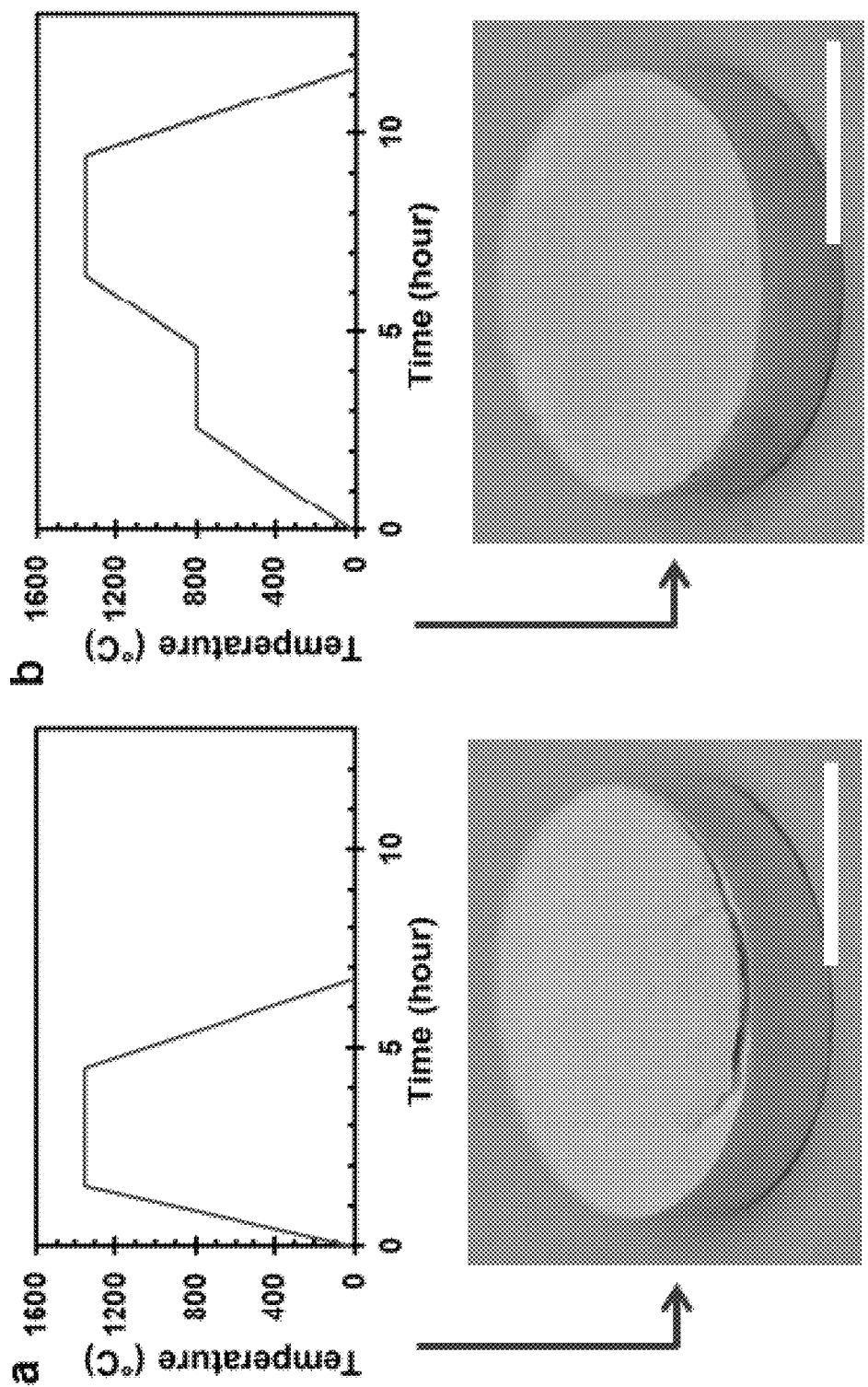
FIG. 7 includes graphs illustrating the effect of sintering temperature profile on the micro-burner structure with the internal cavity: (a) a single ramp-up in temperature resulting in bursting out of the resulting structure shown in the photograph; (b) a dual ramp-up in temperature including a 2-hour-long soaking step at 800° C., allowing graphite fugitive phase to be oxidized before powder consolidation and resulting in an intact structure shown in the photograph. Scale bar is 1 cm in both images.

In a typical LTCC process, the burning of fugitive materials requires large openings because ceramic tapes consisting of the ceramic matrix infiltrated with polymeric or glassy phases are non-porous, leaving little room for gas diffusion. When the pure alumina powder is compacted without any binder phase, the powder compact is still substantially porous, allowing gases (e.g., $O_2$ and $CO/CO_2$) to diffuse in and out. Among many materials serving as fugitive phases, graphite was selected for two reasons. First, graphite has a very low coefficient of the thermal expansion (2~6 µm·$m^{-1} \cdot K^{-1}$), which minimizes the stress exerted onto the powder compact during partial sintering. This is important because the ceramic powders are in an extremely fragile state when the graphite is burnt out. Also the dimension of the integrated cavity can be predicted with better accuracy compared to other polymer-based fugitive phases. Secondly, the graphite burns out before the alumina powder starts to consolidate. Adequate interstitial spaces are provided for the byproducts of graphite oxidation, mainly $CO$ and $CO_2$, to escape. However, each graphite grade is slightly different in its oxidation temperature, and appropriate temperature ramp rate, soaking temperature, and soaking duration values can be determined/modified as desired. FIG. 7 shows the two different sintering temperature profiles (oven temperature vs. time) and the resulting alumina micro-burners. When a full sintering temperature was reached at a constant ramp rate (15° C.·$min^{-1}$) without any soaking step, a crack was observed at the side or corner of the final structure (FIG. 7, panel a photograph). A similar crack was observed even at lower ramp rates. Compacted green ceramic samples were visually inspected using a microscope, and samples with observable cracks due to the improper die pressing were removed from further analysis, and the macroscopic cracked structure in FIG. 7, panel a was not a result of poor powder compaction, but rather by stress developed during sintering.

Crack formation, crack propagation, and structural integrity of the sintered ceramic structure could affected by the sintering temperature profile for several reasons. On one hand, a higher ramp rate would induce a higher temperature gradient within the structure and in turn cause internal stresses to be developed, leading to crack propagation. On the other hand, an insufficient amount of time for graphite to completely burn out would generate a pressure build-up in the internal cavity as the consolidation of alumina powders progresses. The former factor is believed to be less important since no crack was observed in the open-channel configuration regardless of the ramp rate. In the open-channel sample, the graphite phase is fully exposed to outer environment, and therefore there is no restriction for CO/CO$_2$ to be released. Conversely, a competition between graphite volatilization and powder consolidation exists in the fully-enclosed sample. If the alumina powders become consolidated before all graphite phases are burnt out, CO/CO$_2$ has little interstitial space to escape and the pressure will build up until the structure bursts open. This net increase in pressure within the cavity can be attributed to the different gas permeabilities of O$_2$ and CO$_2$ in porous metal oxide structures (see Supplementary Information). To facilitate graphite volatilization, a soaking step holding at a constant temperature of 800° C. was added—the temperature high enough for graphite to burn out while low enough for alumina powders not to sinter (or consolidate) significantly. The modified sintering cycle resulted in crack-free ceramic structures with the internal cavities (FIG. 7, panel b photograph).

To understand the kinetics of the graphite burn-out with and without the presence of alumina powders, thermogravimetric analysis (TGA) was performed on a small piece of graphite and a graphite piece embedded in the alumina powder compact. First, a pure graphite sample was tested to determine the onset temperature of decomposition (or oxidation) for the graphite materials used in this study. FIG. 8, panel a shows a percent weight change as a function of temperature for the pure graphite sample (~10 mg). The temperature was increased from room temperature to 850° C. at a constant ramp rate of 10° C.·min$^{-1}$ with air flowing through the sample chamber. The weight loss started to take place at around 650° C. The onset temperature ($T_d$) of intense thermal decomposition can be determined by the intersection point of tangents to two branches of the TGA curve and be estimated to be approximately 760° C. (FIG. 8, panel a). This observation served as a basis for determining the soaking temperature of 800° C. in FIG. 7.

Next, the TGA experiment for the graphite piece embedded in the alumina powder compact was performed to model the graphite decomposition process in the fabrication of the micro-burner. A small (~7 mm diameter) alumina compact encapsulating a graphite piece was fabricated in the same way that the micro-burner was made. The size of the graphite piece was scaled proportional to the alumina structure such that the mass and volume ratio of graphite to alumina remained the same as the original burner structure. The temperature profile used in the experiment was similar to the partial sintering step of the alumina micro-burner and consisted of (i) temperature rise from room temperature to 800° C. at the ramp rate of 15° C.·min$^{-1}$, (ii) soaking at 800° C. for 2 hours, and (iii) ramping again to 900° C. at the ramp rate of 15° C.·min$^{-1}$. The weight loss as a function of temperature is shown for the "graphite with alumina" sample in FIG. 8, panel b. A noticeable decrease in weight was observed around 760° C., corresponding to the onset temperature of the graphite decomposition. In the final ramping step (from 800° C. to 900° C.), no apparent weight loss was witnessed, suggesting that the entire graphite phase was completely burnt out during the 2-hour soaking step at 800° C. After cooling down, the graphite/alumina sample was retrieved and inspected under the optical microscope. No crack was visible in the sample. Therefore, it was concluded that the modified sintering schedule was capable of completely removing the graphite phase without damaging the ceramic structure. Further, a small yet measurable (~0.5%) decline in weight in the initial ramping step (from room temperature to 650° C.) was observed. Since no weight loss was seen in the pure graphite sample up to 650° C., the alumina powder should be responsible for this initial weight loss. To understand this trend, further testing of only the alumina powder was performed for the same mass with the same operating condition and a similar initial decrease in weight was observed (FIG. 8, panel b dotted line). The loss in mass was attributed water loss based on the hygroscopic nature of alumina powder—consisting of high-surface-area sub-micron-particles that absorbed moisture from the ambient environment. Upon heating, bound water was desorbed, leading to the initial weight loss.

The linear shrinkage of alumina in air was measured by thermomechanical analysis (TMA) and is shown as a function of time and temperature in FIG. 9, panels a and b, respectively. The sintering temperature profile used in the TMA experiment was the same as the micro-burner sintering process. After an initial dip (which is related to the translation deformation induced by the load), there is a constant increase in displacement up to 800° C., representing the thermal expansion of alumina powders. Because sintering had not occurred significantly below 800° C., thermal expansion dominates over particle consolidation. In the 2-hour soaking period at 800° C., the dimension of the sample did not change—the isothermal condition causing neither thermal expansion nor particle consolidation. Lack of shrinkage in the alumina sample at that temperature also indicates that the pores in the sample were still interconnected, allowing CO/CO$_2$ emitted from graphite oxidation to escape without much barrier. The densification rate, a time derivative of displacement, is also plotted with temperature in FIG. 9, panel b, showing that the temperatures for the onset of densification and the maximum densification rate are around 965° C. and 1306° C., respectively. It also suggests that sintering and densification essentially stopped at the temperature above 1350° C. Finally, during the cool-down process, the sample shrunk due to thermal contraction.

The TMA results were compared to the dimensional change of the micro-burner measured from the cross-sectional image (FIG. 4). Table 1 shows the overall size and internal channel dimension of the alumina micro-burner at each process stage. The green state (after compaction) of the sample had the diameter of 22.2 mm and the thickness of 4.98 mm. Just as the TMA shrinkage indicated, the sample size barely changed after the partial sintering at 800° C. However, dimensional changes over 18% were made at the end of the full sintering process around 1350° C. The similar dimensional reduction was observed for the internal channel. Dimensional shrinkage also can be inferred from the density (or volume) ratio of the green and sintered sample. As a result of the disclosed process in these examples, the relative densities of the green and sintered ceramics were estimated about 52% and 96%, respectively. The volume ratio is then: $V_{sintered}/V_{green}=(1-S)(1-S)(1-S)=52/96=54\%$, where S is a dimensionless shrinkage (assumed to be the same in all three directions). This leads to S≈18.6%, which is consistent with the TMA results (maximum shrinkage rate of 18.3%) and the other reported values. The volume ratio of 54% also suggests that the green-state ceramics (after compaction) are 40~50% porous. Since the TMA result indicates no significant shrinkage up to 1000° C., the partially sintered alumina possesses the same level of high porosity, providing sufficient gas permeability for the graphite removal through the fully-enclosed structure.

TABLE 1

Change in overall size and internal channel dimensions of alumina micro-burner

| Alumina Sample Dimension (all units in mm) | Green state (after compaction) | 800° C. (partial sintering) | 1350° C. (% Shrinkage) (full sintering) |
| --- | --- | --- | --- |
| Overall Diameter | 22.22 | 22.14 | 18.11 (18.5%) |
| Overall Thickness | 4.98 | 4.90 | 4.02 (19.2%) |
| Channel Height | 0.9 | 0.89 | 0.74 (17.7%) |
| Channel Width | 2.19 | 2.15 | 1.79 (18.2%) |

Machining of Partially Sintered Ceramic (PSC):

Fully sintered ceramics including alumina are known to have poor machinability due to their stiffness and brittleness. Machining green or white ceramic compacts would be easier if the final tolerance is not strict. Green machining is referred to as the machining of a ceramic in the unfired state, i.e., a powder compact before exposing to high temperature. In green machining, the powder is usually mixed with a binder phase (typically organic polymer or wax) to achieve the sufficient strength for machining. In these examples according to the disclosure, pure alumina powder was utilized without any binder phase. Therefore, the compacted powder was too difficult to handle and prone to fragment during machining, preventing performance of green machining. On the other hand, white machining is an approach to machining on partially sintered ceramics (PSC). The powder compacts can be partially sintered by firing at a temperature substantially below their typical sintering temperature. The formation of necks among the individual powder particles during partial sintering provides PSCs with the strength to withstand machining. These examples use a white machining technique to create fluidic connections to the enclosed channels in the micro-burner.

The extent of neck formation in PSCs, which determines the strength of the powder compact, highly depends on partial sintering temperature. For this reason, the partial sintering condition such as pre-sintering temperature and its duration has been shown to significantly affect the quality of the machined features. To understand the effect of partial sintering temperature on the machined features on PSCs, four alumina samples were prepared that were partially sintered at four different temperatures (600° C., 800° C., 1000° C., and 1200° C.). The conventional machining processes such as drilling and milling were performed on these PSC samples using a small bench-top CNC machine. The quality of the machined features was correlated to the amount of chips and cracks generated around holes during machining. The optimal machining parameters for the PSCs included a feed rate of 1 mm·min$^{-1}$ and cutting speed of 1500 rpm for these examples.

Figure 10:
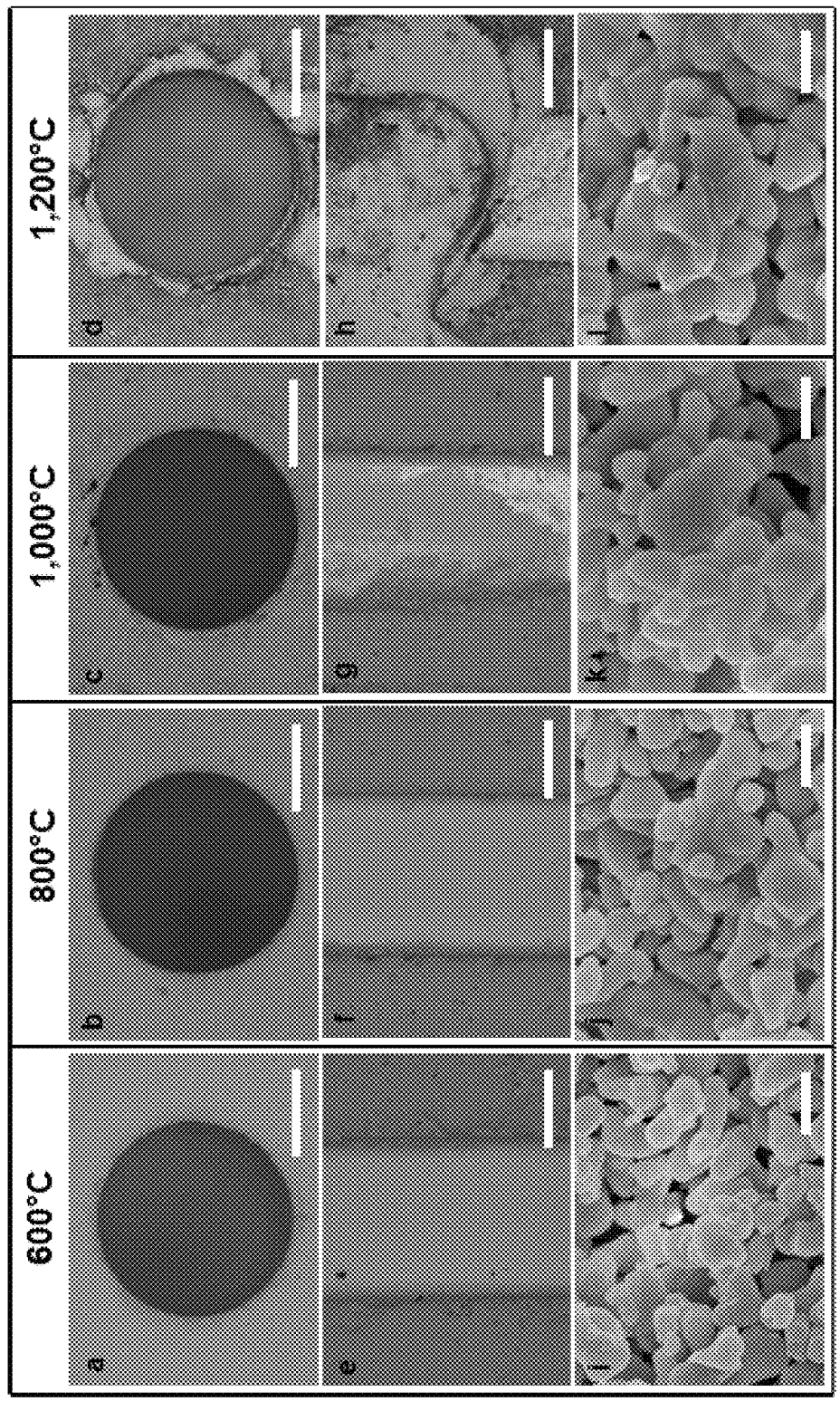
FIG. 10 includes optical microscope images and scanning electron microscope (SEM) images showing the effect of the partial sintering temperature (four different temperatures: 600, 800, 1000, 1200° C.) on the machined features of alumina partially sintered ceramics: (a-d) optical microscope images of 1 mm diameter drilled holes and (e-h) optical microscope images of 1 mm wide milled grooves; (i-l) SEM images of the corresponding microstructures. Scale bars are 0.5 mm for (a-h) and 200 nm for (i-l).

FIG. 10 shows the effect of the partial sintering temperature on the machined features of alumina PSCs. The alumina sample partially sintered at 800° C. exhibited no pronounced surface chipping or cracks around the edges of the holes and grooves (FIG. 10, panels b and f). Minor cracks and chips were observed in the sample partially sintered at 600° C. (FIG. 10, panels a and e) while more noticeable defects were seen for the 1000° C. sample (FIG. 10, panels c and g). The sample partially sintered at 1200° C. exhibited the extensive chipping damages around the edges of the machined features (FIG. 10, panels d and h). X-ray diffraction (XRD) analysis (not shown) on the green (unfired) ceramic and these four PSCs suggests that the starting alumina powder is in the α-phase and there is no phase change during partial or full sintering. Therefore, the marked differences in the machined features of the alumina PSCs partially sintered at the different temperatures are not likely coming from the phase change of alumina. Unlike metals whose major removal mechanism is a local shear deformation, the underlying mechanism of machining PSCs is related to the breakage of necks between particles. When the partial sintering temperature increased from 600 to 800° C. (i.e., initial stage of partial sintering), more neck formation occurred, providing stronger connections among individual particles and more resistance to chipping or cracks. However, once the partial sintering temperature increased to 1000° C. or above, the consolidation taking place beyond the neck formation was too extensive such that brittle fracture became a dominant material removal mechanism. The high-resolution scanning electron microscopy (SEM) images in FIG. 10, panels j-l show the extent of the neck formation and particle consolidation (or lack of porosity) for these four samples. Extensive neck formation on the powder compact can be clearly observed for the samples with higher partial sintering temperatures. To further characterize the mechanical properties of the PSCs sintered at different temperatures and correlate them to the observed machining behaviors, a 3-point bending test was conducted to measure the flexural strength of the PSCs. The bending test demonstrated the higher flexural strength with the increasing partial sintering temperature. Combined with the results shown in FIG. 10, it is concluded that the PSC sample partially sintered at 600° C. was too fragile to machine, while the sample partially sintered at 1200° C. was strong but too brittle to machine.

Figure 11:
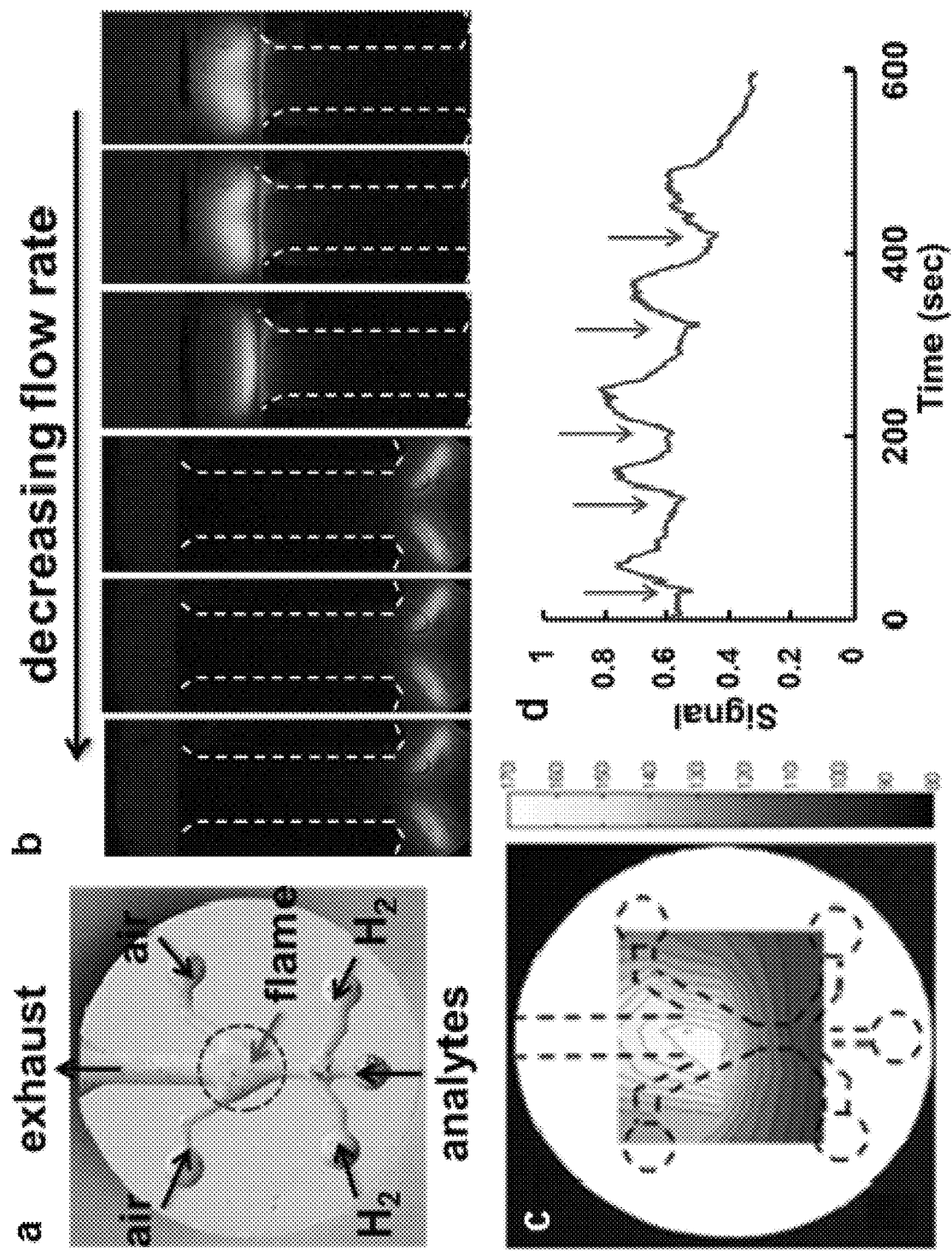
FIG. 11 shows results from micro-burner testing: (a) a photograph of the open-channel alumina micro-burner (18 mm in diameter); (b) flame characterization-reduction in a $H_2$ flow rate anchoring a flame in the micro-burner; (c) temperature distribution of the embedded micro-burner, indirectly representing the flame location; (d) signal collected upon natural gas injection after the micro-burner configured as a micro flame ionization detector (arrows indicating the injection events).

Micro-Burner Testing:

The fully-sintered alumina sample was tested for micro-burner applications. Both open-channel and embedded-channel configurations were tested. FIG. 11, panel a shows how the fuel ($H_2$) and oxidant ($O_2$ or air) streams are connected to the micro-burner as well as the location of the exhaust. Hydrogen generated by an electrolyzer and air from a miniature gas pump were fed to the open-channel micro-burner (bonded with a quartz window; FIG. 3, panel e1). Under the laminar flow condition, these two streams create a stable hydrodynamic boundary layer in the flame region where a folded diffusion flame would be formed. When the $H_2$ flow rate was high (~100 sccm), the flame was ignited at the outside of the exhaust channel (FIG. 11, panel b). As the $H_2$ flow rate (controlled by the electrical power applied to the electrolyzer) was reduced to 30~50 sccm, the flame started to move into the exhaust channel and eventually became anchored in the cavity. In order to reduce the amount of air that needed to be pumped, an $O_2$ flow co-generated by the electrolyzer was added to the oxidant stream. The oxidant flow rate ($O_2$ plus air) was determined to keep the fuel-to-oxidant ratio stoichiometrically correct or under lean-burn condition. A stable folded flame was observed for the range of the hydrogen flow rates (40~55 sccm) and oxidant flow rates (20~27 sccm for oxygen and 20~80 sccm for air).

After identifying the $H_2$ and air flow rates that anchored the flame inside the combustion chamber, the enclosed micro-burner was tested with the similar flow conditions. The flame generated within the enclosed micro-burner cannot be observed due to the opaque nature of the alumina walls. Therefore, the presence and approximate location of the flame was indirectly determined by recording the outer wall temperature of the micro-burner. FIG. 11, panel c depicts the temperature distribution of the burner's exterior surface measured by the thermocouple from 7 by 7 points (49 total measurements with each point 1.5 mm apart). The region of the highest temperature indicates the location of the flame, which resembles the flame location of the quartz/alumina micro-burner. The maximum steady-state temperature of the alumina outer surface was measured to be around 170° C. (for flow rate conditions: $H_2$ 35 sccm and $O_2$ 17.5 sccm/air 20 sccm). This temperature is much lower than the adiabatic flame temperature of the oxy-hydrogen flame, which is between 2210 and 3200° C. depending on the fuel-to-oxidant ratio and oxygen-to-air ratio in the oxidant stream. The low thermal conductivity of alumina (12~38 $W \cdot m^{-1} \cdot K^{-1}$) therefore provided reasonable thermal isolation compared to the other common micro-burner materials like metals or silicon. The enclosed micro-burner was continuously operated for more than 6 hours with the stable flame throughout. More than 10 micro-burners have been tested over a 10-month period, and no structural damage has been observed due to the high operation temperature or repeated heating/cooling (i.e. thermal stresses) from each run.

Finally, the alumina micro-burner was tested as a micro flame ionization detector (µFID). Two tungsten wires (0.5 mm diameter) were inserted into the exhaust to serve as electrodes. A flame was ignited and anchored into the micro-burner cavity with the flow rate conditions of $H_2$ 45 sccm and $O_2$ 22.5 sccm/air 20 sccm. This oxy-hydrogen flame ionizes hydrocarbon molecules, and the produced ions are driven by the applied electric field and collected by the electrodes. Without further optimization, train of 0.1 mL of natural gas was injected through the analyte port using a gas-tight syringe at times shown by the arrows in FIG. 11, panel d. With the applied voltage of 160 V between the electrodes, a generated current was converted to an amplified voltage via a transimpedance amplifier (gain=$10^5$). Each peak in FIG. 11, panel d corresponds to each event of natural gas injection. Due to large dead volumes associated with the injection port and the manual syringe injection setup, the obtained signals were short and broad. The electrode design and operation conditions were far from being optimal, and therefore the further characterization of the µFID would significantly improve the device performance. Though the performance of the µFID does not quite match that of the state-of-the-art system, this testing demonstrates a practical use of the micro-burner created by the proposed ceramic processing.

Summary:

These examples illustrate methods and apparatus according to the disclosure for processing ceramic metal oxide powders to fabricate ceramic structures with internal cavities and channels for microchemical system applications. High-purity, binder-free alumina micron-powder was compacted with a graphite fugitive phase embedded in the powder bed. The graphite was later burnt out during partial sintering, leaving the cavity and channels. The sintering schedule used in partial (and full) sintering critically influenced the structural integrity of the final alumina structure. Instead of the continuous temperature ramping to the full sintering temperature, the compacted alumina was partially sintered at 800° C. for two hours, which not only facilitated the removal of the graphite fugitive phase but also promoted the optimal neck formation for the subsequent machining processes. The TGA and TMA results showing graphite oxidation and alumina densification kinetics supported the competing nature of graphite burn-out and powder consolidation. The quality of the machined features on the partially sintered alumina was investigated using various imaging techniques, revealing that the partial sintering temperature is an important parameter for machining. Finally, the fabricated open-channel and fully-enclosed alumina micro-burners were tested in various flow rate conditions of hydrogen and oxygen/air, demonstrating that the fully-enclosed device functioned as designed without failing over long-term and cyclic operations.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

All patents, patent applications, government publications, government regulations, and literature references cited in this specification are hereby incorporated herein by reference in their entirety. In case of conflict, the present description, including definitions, will control.

Throughout the specification, where the compounds, compositions, methods, apparatus, and processes are described as including components, steps, or materials, it is contemplated that the compositions, processes, or apparatus can also comprise, consist essentially of, or consist of, any combination of the recited components or materials, unless described otherwise. Component concentrations can be expressed in terms of weight concentrations, unless specifically indicated otherwise. Combinations of components are contemplated to include homogeneous and/or heterogeneous mixtures, as would be understood by a person of ordinary skill in the art in view of the foregoing disclosure.

PARTS LIST

10 microchemical apparatus
20 filling/compression die
30 furnace
100 metal oxide powder(s)
110 first metal oxide powder
110A first metal oxide powder area (e.g., cross-sectional/surface area)
120 second metal oxide powder
150 non-sintered compact including fugitive phase
200 fugitive phase(s)
210 first fugitive phase material
210A first fugitive phase material area (e.g., cross-sectional/surface area)
212 geometry of first fugitive phase material
214 end/edge of first fugitive phase material at external boundary
300 partially sintered compact
310 interior cavity within partially sintered compact
312 geometry of interior cavity
320 porous wall/body of partially sintered compact
330 machined structures within partially sintered compact (e.g., holes, channels, inlet/outlet orifices, etc.)
400 fully sintered microchemical apparatus
410 interior cavity within fully sintered microchemical apparatus
410A combustion area
420 solid (e.g., continuous or non-porous) body of fully sintered microchemical apparatus
430 inlets/outlets to interior cavity P plane of first metal oxide powder into which first fugitive phase material is placed

REFERENCES

1. McMullen, J. P. & Jensen, K. F. Integrated microreactors for reaction automation: New approaches to reaction development. *Annu. Rev. Anal. Chem.* 3, 19-42 (2010).
2. Jensen, K. F. Microreaction engineering—is small better?. *Chem. Eng. Sci.* 56, 293-303 (2001).
3. Marre, S., Adamo, A., Basak, S., Aymonier, C. & Jensen, K. F. Design and packaging of microreactors for high pressure and high temperature applications. *Ind. Eng. Chem. Res.* 49, 11310-11320 (2010).
4. deMello, A. J. Control and detection of chemical reactions in microfluidic systems. *Nature* 442, 394-402 (2006).
5. Jensen, K. F., Reizman, B. J. & Newman, S. G. Tools for chemical synthesis in microsystems. *Lab on a Chip* 14, 3206-3212 (2014).
6. Suzuki, T., Yamaguchi, T., Fujishiro, Y., Awano, M. & Funahashi, Y. Recent development of microceramic reactors for advanced ceramic reactor system. *J. Fuel Cell Sci. Technol.* 7, 31005-31009 (2010).
7. Garbayo, I. et al. Full ceramic micro solid oxide fuel cells: towards more reliable MEMS power generators operating at high temperatures. *Energy Environ. Sci.* 7, 3617-3629 (2014).
8. Suzuki, T., Yamaguchi, T., Sumi, H., Hamamoto, K. & Fujishiro, Y. Microtubular solid-oxide fuel cells for low-temperature operation. *MRS Bull.* 39, 805-809 (2014).
9. Beckel, D. J. et al. Thin films for micro solid oxide fuel cells. *J. Power Sources* 173, 325-345 (2007).
10. Jiang, B. et al. Design and packaging of a highly integrated microreactor system for high-temperature on-board hydrogen production. *Chem. Eng. J.* 275, 206-219 (2015).
11. Cocco, D. & Tola, V. Externally reformed solid oxide fuel cell—micro-gas turbine (SOFC-MGT) hybrid systems fueled by methanol and di-methyl-ether (DME). *Energy* 34, 2124-2130 (2009).
12. LindstrÖm, B. et al. Diesel fuel reformer for automotive fuel cell applications. *Int. J. Hyd. Energy* 34, 3367-3381 (2009).
13. Miesse, C. M., Masel, R. I., Jensen, C. D., Shannon, M. A. & Short, M. Submillimeter-scale combustion. *AIChE J.* 50, 3206-3214 (2004).
14. Keramiotis, C., Stelzner, B., Trimis, D. & Founti, M. Porous burners for low emission combustion: An experimental investigation. *Energy* 45, 213-219 (2012).
15. Di Carlo, A., Bocci, E. & Dell'Era, A. Comparison by the use of numerical simulation of a MCFC-IR and a MCFC-ER when used with syngas obtained by atmospheric pressure biomass gasification, *Int. J. Hyd. Energy* 36, 7976-7984 (2011).
16. Mandl, C., Obernberger, I. & Biedermann, F. Modelling of an updraft fixed-bed gasifier operated with softwood pellets. *Fuel* 89, 3795-3806 (2010).
17. Christian, Mitchell, M., Kim, D. -P. & Kenis, P. J. A. Ceramic microreactors for on-site hydrogen production. *J. Catal.* 241, 235-242 (2006).
18. Christian, Mitchell, M. & Kenis, P. J. A. Ceramic microreactors for on-site hydrogen production from high temperature steam reforming of propane. *Lab Chip* 6, 1328-1337 (2006).
19. Knitter, R. & Liauw, M. A. Ceramic microreactors for heterogeneously catalysed gas-phase reactions. *Lab Chip* 4, 378-383 (2004).
20. Arana, L. R., Schaevitz, S. B., Franz, A. J., Schmidt, M. A. & Jensen, K. F. A microfabricated suspended-tube chemical reactor for thermally efficient fuel processing. *J. Microelectromech. Syst.* 12, 600-612 (2003).
21. Guan, G., Kusakabe, K., Taneda, M., Uehara, M. & Maeda, H. Catalytic combustion of methane over pd-based catalyst supported on a macroporous alumina layer in a microchannel reactor. *Chem. Eng. J.* 144, 270-276 (2008).
22. Jain, K. et al. Synthesis of nanoparticles in high temperature ceramic microreactors: design, fabrication and testing. *Int. J. Appl. Ceram. Technol.* 6, 410-419 (2009).
23. Knitter, R., Bauer, W., Göhring, D. & Haußelt, J. Manufacturing of ceramic microcomponents by a rapid prototyping process chain. *Adv. Eng. Mater.* 3, 49-54 (2001).
24. Tiggelaar, R. M. et al. Fabrication and characterization of high-temperature microreactors with thin film heater and sensor patterns in silicon nitride tubes. *Lab Chip* 5, 326-336 (2005).
25. Morales, A. M., Pitchumani, R., Garino, T. J., Gutmann, A. K. & Domeier, L. A. Fabrication of ceramic microstructures via microcasting of nanoparticulate slurry. *J. Am. Ceram. Soc.* 88, 570-578 (2005).
26. Christian & Kenis, P. J. A. Fabrication of ceramic microscale structures. *J. Am. Ceram. Soc.* 90, 2779-2783 (2007).
27. Schmitt, C. et al. Ceramic plate heat exchanger for heterogeneous gas phase reactions *Chem. Eng. Technol.* 28, 337-343 (2005).
28. Jurków, D. et al. Overview on low temperature co-fired ceramic sensors. *Sensor. Actuat. A: Phys.* 233, 125-146 (2015).
29. Bauer, W. & Knitter, R. Development of a rapid prototyping process chain for the production of ceramic microcomponents. *J. Mater. Sci.* 37, 3127-3140 (2002).
30. Bauer, W. et al. Design and prototyping of a ceramic micro turbine: a case study. *Microsyst. Technol.* 16, 607-615 (2010).
31. Holthaus, M. G., Treccani, L. & Rezwan, K. Comparison of micropatterning methods for ceramic surfaces. *J. Eur. Ceram. Soc.* 31, 2809-2817 (2011).
32. Gongora-Rubio, M. R., Espinoza-Vallejos, P., Sola-Laguna, L. & Santiago-Avilés, J. J. Overview of low temperature co-fired ceramics tape technology for meso-system technology (MsST). *Sensor. Actuat. A: Phys.* 89, 222-241 (2001).
33. Peterson, K. A. et al. Novel microsystem applications with new techniques in low-temperature co-fired ceramics. *Int. J. Appl. Ceram. Technol.* 2, 345-363 (2005).
34. Ibáñez-Garciá, N., Alonso, J., Martínez-Cisneros, C. S. & Valdés, F. Green-tape ceramics.
New technological approach for integrating electronics and fluidics in microsystems. *TrAC Trends Anal. Chem.* 27, 24-33 (2008).
35. Khoong, L. E., Tan, Y. M. & Lam, Y. C. Overview on fabrication of three-dimensional structures in multi-layer ceramic substrate. *J. Eur. Ceram. Soc.* 30, 1973-1987 (2010).
36. Bienert, C. & Roosen, A. Characterization and improvement of {LTCC} composite materials for application at elevated temperatures. *J. Eur. Ceram. Soc.* 30, 369-374 (2010).
37. Khoong, L. E., Tan, Y. M. & Lam, Y. C. Carbon burnout and densification of self-constrained {LTCC} for fabrication of embedded structures in a multi-layer platform. *J. Eur. Ceram. Soc.* 29, 457-463 (2009).

38. Roosen, A. New lamination technique to join ceramic green tapes for the manufacturing of multilayer devices. *J. Eur. Ceram. Soc.* 21, 1993-1996 (2001).
39. Kim, J., Bae, B., Hammonds, J., Kang, T. & Shannon, M. A. Development of a micro-flame ionization detector using a diffusion flame. *Sensor. Actuat. B: Chem.* 168, 111-117 (2012).
40. Bae, B. et al. Development of a portable gas analyzer using a micro-gas chromatograph/flame ionization detector (micro-GC/FID) for NASA's environmental missions. *42nd International Conference on Environmental Systems;* 15-19 *Jul.* 2012; *San Diego, Calif., USA;* (AIAA, 2012).
41. Swain, S., Sharma, R. A. & Bhattacharya, S. Effects of nano-silica/nano-alumina on mechanical and physical properties of polyurethane composites and coatings. *Trans. Electric. Electro. Mater.* 14, 1-8 (2013).
42. Yeh, T. -S. & Sacks, M. D. Effect of particle size distribution on the sintering of alumina. *J. Am. Ceram. Soc.* 71, 484-487 (1988).
43. Hillman, S. H. & German, R. M. Constant heating rate analysis of simultaneous sintering mechanisms in alumina. *J. Mater. Sci.* 27, 2641-2648 (1992).
44. Fujiwara, S., Tamura, Y., Maki, H., Azuma, N. & Takeuchi, Y. Development of new high-purity alumina. *Sumitomo Kagaku* 1-10 (2007).
45. Shin, H., Kwon, P., Kok, C. K. & Case, E. Machining channels on mesoscale ceramic components. *J. Manuf. Process.* 6, 15-23 (2004).
46. Halcomb, L. D. & Rey, M. C. Ceramic cutting tools for machining unsintered compacts of oxide ceramics. *Ceram. Bull.* 61, 1311-1314 (1982).
47. Klocke, F., Gerent, 0. & Schippers, C. Machining of advanced ceramics in the green state. *Ceram. Forum Int.* 74, 288-290 (1997).
48. Klocke, F., Gerent, O. & Schippers, C. in *Machining Of Ceramics And Composites* (eds Jahanmir, S. et al.) Ch. 1, 1-10 (Marcel Dekker, 1998).
49. German, R. M. *Sintering Theory And Practice.* (Wiley, 1996).

What is claimed is:

1. A method for forming a microchemical apparatus, the method comprising:
   (a) providing a first metal oxide powder;
   (b) placing a first fugitive phase material in the first metal oxide powder, the first fugitive phase material having a geometry corresponding to a negative cavity geometry in the formed microchemical apparatus, and (ii) a surface area of 50% or less of a surface area of a layer of the first metal oxide powder in a plane on which the first fugitive phase material is placed;
   (c) placing a second metal oxide powder over the first metal oxide powder and over the first fugitive phase material;
   (d) partially sintering the first metal oxide powder and the second metal oxide powder at a temperature and pressure sufficient (i) to convert the first fugitive phase material to a gaseous material and (ii) to convert the first metal oxide powder and the second metal oxide powder to a porous, partially sintered compact, thereby allowing the gaseous material to escape from an interior volume of the partially sintered compact and forming an interior cavity within the partially sintered compact interior volume having a geometry corresponding to the original first fugitive phase material geometry;
   (e) optionally machining the partially sintered compact; and
   (f) fully sintering the partially sintered compact at a temperature and pressure sufficient to form a fully sintered microchemical apparatus comprising the interior cavity;
   wherein:
      the microchemical apparatus has a structure adapted to function as a combustor;
      the microchemical apparatus comprises a plurality of inlet ports, an outlet port, and a combustion area defined by the interior cavity;
      each of the inlet ports and the outlet port are in fluid communication with the combustion area; and
      each of the inlet ports and the outlet port are in fluid communication with each other via the combustion area.

2. The method of claim 1, wherein the first metal oxide powder and the second metal oxide powder substantially do not include a binder phase.

3. The method of claim 1, wherein the first metal oxide powder and the second metal oxide powder independently have a particle size in a range from 1 nm to 1000 nm.

4. The method of claim 1, wherein the first metal oxide powder and the second metal oxide powder comprise the same or different ceramic material.

5. The method of claim 1, wherein the first metal oxide powder and the second metal oxide powder comprise one or more of aluminum oxide, zirconium oxide, hydroxyapatite, and zirconiatungstate.

6. The method of claim 1, wherein the first fugitive phase material comprises graphite.

7. The method of claim 1, wherein the first fugitive phase material is in the form of a single piece.

8. The method of claim 1, wherein the first fugitive phase material has a minimum dimension in a range from 1 μm to 1000 μm.

9. The method of claim 1, wherein the first fugitive phase material has a minimum dimension in a range from 1 nm to 1000 nm.

10. The method of claim 1, wherein the first fugitive phase material is substantially free from sharp edges.

11. The method of claim 1, wherein the first fugitive phase material has a coefficient of thermal expansion of 10 μm/(m*K) or less.

12. The method of claim 1, wherein partially sintering comprises heating to a temperature in a range from 700° C. to 900° C.

13. The method of claim 1, wherein fully sintering comprises heating to a temperature in a range from 1100° C. to 2000° C.

14. The method of claim 1, wherein the fully sintered microchemical apparatus has a density of at least 80% relative to the theoretical density of the first and second metal oxide powders.

15. The method of claim 1, wherein the interior cavity of the microchemical apparatus has a surface roughness of 20 μm or less.

16. The method of claim 1, further comprising before partially sintering in part (d):
   placing a second fugitive phase material in the second metal oxide powder, the second fugitive phase material having a geometry corresponding to a negative cavity geometry in the formed microchemical apparatus; and
   placing a third metal oxide powder over the second metal oxide powder and over the second fugitive phase material;

wherein partially sintering in part (d) further comprises:
partially sintering the first, second, and third metal oxide powders at a temperature and pressure sufficient (i) to convert the first and second fugitive phase materials to a gaseous material and (ii) to convert the first, second, and third metal oxide powders to a porous, partially sintered compact, thereby allowing the gaseous material to escape from the partially sintered compact interior volume and forming one or more interior cavities within the partially sintered compact interior volume having a geometry corresponding to the original first and second fugitive phase material geometries.

17. The method of claim 1, wherein the fully sintered microchemical apparatus comprises:
a fully sintered metal oxide body comprising the interior cavity within the body;
wherein:
the interior cavity has a minimum dimension in a range from 1 μm to 1000 μm; and
the interior cavity has a surface roughness of 20 μm or less.

18. The method of claim 17, wherein the fully sintered metal oxide body has a density of at least 80% relative to the theoretical density of the first and second metal oxide powders.

19. The method of claim 17, wherein the interior cavity is fully enclosed by the fully sintered metal oxide body.

20. The method of claim 17, wherein the interior cavity is partially enclosed by the fully sintered metal oxide body.

21. The method of claim 1, further comprising machining the partially sintered compact to define at least one of the inlet ports and the outlet port.

22. The method of claim 1, wherein the first fugitive phase material has an exposed edge at an external boundary of the microchemical apparatus that defines at least one of the inlet ports and the outlet port.

23. The method of claim 1, wherein at least one inlet port is disposed on a first side of the interior cavity and at least one other inlet port is disposed on a second side of the interior cavity.

24. The method of claim 1, wherein:
the microchemical apparatus further comprises a plurality of inlet channels and an outlet channel defined by the interior cavity;
each inlet channel provides fluid communication between its corresponding inlet port and the combustion area; and
the outlet channel provides fluid communication between the outlet port and the combustion area.

25. The method of claim 1, wherein the microchemical apparatus comprises a first side and a second side and wherein the combustion area has a longitudinal axis that extends between the first and second sides and wherein the inlet ports are arranged along the longitudinal axis.

26. The method of claim 1, wherein the first metal oxide powder and the second metal oxide powder comprise the same ceramic material.

27. The method of claim 1, wherein the first fugitive phase material has a surface area of 5% to 30% of a surface area of a layer of the first metal oxide powder in a plane on which the first fugitive phase material is placed.

* * * * *